US011329119B2

(12) United States Patent
You et al.

(10) Patent No.: US 11,329,119 B2
(45) Date of Patent: May 10, 2022

(54) DISPLAY APPARATUS AND METHOD OF MANUFACTURING THE SAME

(71) Applicant: SAMSUNG DISPLAY CO., LTD., Yongin-si (KR)

(72) Inventors: Chungi You, Yongin-si (KR); Hyounghak Kim, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/997,070

(22) Filed: Aug. 19, 2020

(65) Prior Publication Data

US 2021/0249494 A1    Aug. 12, 2021

(30) Foreign Application Priority Data

Feb. 11, 2020 (KR) .................. 10-2020-0016638

(51) Int. Cl.
*H01L 27/32* (2006.01)
*H01L 25/18* (2006.01)
*H01L 51/52* (2006.01)
*H01L 51/00* (2006.01)

(52) U.S. Cl.
CPC .......... *H01L 27/3272* (2013.01); *H01L 25/18* (2013.01); *H01L 27/3262* (2013.01); *H01L 27/3276* (2013.01); *H01L 27/323* (2013.01); *H01L 27/3246* (2013.01); *H01L 27/3258* (2013.01); *H01L 2227/323* (2013.01)

(58) Field of Classification Search
CPC ............... H01L 27/3272; H01L 27/323; H01L 27/3246; H01L 27/3258; H01L 27/3276; H01L 27/3262; H01L 25/18; H01L 2227/323

See application file for complete search history.

(56) References Cited

U.S. PATENT DOCUMENTS

| 7,525,696 B2 | 4/2009 | Carnevali et al. |
| 8,997,474 B2 | 4/2015 | Lewry et al. |
| 2006/0256400 A1 | 11/2006 | Carnevali |

(Continued)

FOREIGN PATENT DOCUMENTS

| KR | 10-1406129 | 6/2014 |
| KR | 10-1598258 | 2/2016 |

(Continued)

*Primary Examiner* — Mohsen Ahmadi
(74) *Attorney, Agent, or Firm* — F. Chau & Associates, LLC

(57) ABSTRACT

A display apparatus includes: a main display area; a component area including a transmission area; a peripheral area adjacent to the main display area; a substrate; main display elements arranged on a first surface of the substrate in the main display area, wherein main pixel circuits are respectively connected to the main display elements; auxiliary display elements arranged on the first surface of the substrate in the component area, wherein auxiliary pixel circuits are respectively connected to the auxiliary display elements; a bottom metal layer arranged between the substrate and the auxiliary pixel circuits in the component area; and an anti-reflection layer arranged on a second surface, opposite to the first surface, of the substrate, and overlapping the bottom metal layer in the component area.

8 Claims, 13 Drawing Sheets

(56) References Cited

U.S. PATENT DOCUMENTS

| | | | |
|---|---|---|---|
| 2013/0258234 A1 | 10/2013 | Park et al. | |
| 2014/0028181 A1* | 1/2014 | Lee | H01L 27/322 313/504 |
| 2016/0155786 A1* | 6/2016 | Park | H01L 27/322 257/40 |
| 2016/0190454 A1* | 6/2016 | You | H01L 27/3265 257/40 |
| 2016/0300902 A1* | 10/2016 | You | H01L 27/3258 |
| 2016/0321996 A1* | 11/2016 | Lee | G09G 3/3233 |
| 2016/0372497 A1* | 12/2016 | Lee | H01L 27/1222 |
| 2017/0271416 A1* | 9/2017 | Ryu | H01L 25/167 |
| 2018/0364869 A1 | 12/2018 | Lee et al. | |
| 2019/0172885 A1* | 6/2019 | Lee | H01L 27/3258 |
| 2019/0179132 A1 | 6/2019 | Kang et al. | |
| 2019/0293980 A1* | 9/2019 | Inoue | H01L 27/1248 |
| 2020/0006697 A1* | 1/2020 | Jung | H01L 51/5243 |
| 2020/0168670 A1* | 5/2020 | Kim | H01L 27/3211 |
| 2020/0258967 A1* | 8/2020 | Kim | H01L 27/326 |
| 2020/0286972 A1* | 9/2020 | Seo | G09G 3/3225 |

FOREIGN PATENT DOCUMENTS

| | | |
|---|---|---|
| KR | 10-2018-0136386 | 12/2018 |
| KR | 10-2019-0067685 | 6/2019 |

* cited by examiner

DISPLAY APPARATUS AND METHOD OF MANUFACTURING THE SAME

CROSS-REFERENCE TO RELATED APPLICATION

This application claims priority under 35 U.S.C. § 119 to Korean Patent Application No. 10-2020-0016638, filed on Feb. 11, 2020, in the Korean Intellectual Property Office, the disclosure of which is incorporated by reference herein in its entirety.

TECHNICAL FIELD

One or more embodiments of the present invention relate to a display apparatus and a method of manufacturing the same, and more particularly, to a display apparatus with increased reliability and a method of manufacturing the same.

DISCUSSION OF THE RELATED ART

Generally, display apparatuses are used for various purposes. In addition, as display apparatuses have become thinner and lighter, their range of use has increased.

Since display apparatuses are being used in various ways, various methods may be used to design the shapes of display apparatuses, and further, more functions may be combined or associated with display apparatuses.

SUMMARY

According to an exemplary embodiment of the present invention, a display apparatus includes: a main display area; a component area including a transmission area; a peripheral area adjacent to the main display area; a substrate; main display elements arranged on a first surface of the substrate in the main display area, wherein main pixel circuits are respectively connected to the main display elements; auxiliary display elements arranged on the first surface of the substrate in the component area, wherein auxiliary pixel circuits are respectively connected to the auxiliary display elements; a bottom metal layer arranged between the substrate and the auxiliary pixel circuits in the component area; and an anti-reflection layer arranged on a second surface, opposite to the first surface, of the substrate, and overlapping the bottom metal layer in the component area.

In an exemplary embodiment of the present invention, the anti-reflection layer is directly arranged on the second surface of the substrate.

In an exemplary embodiment of the present invention, the anti-reflection layer has a first thickness of about 1 µm to about 3 µm.

In an exemplary embodiment of the present invention, the anti-reflection layer includes a positive photosensitive material.

In an exemplary embodiment of the present invention, the anti-reflection layer includes a light blocking material.

In an exemplary embodiment of the present invention, the bottom metal layer includes a first hole corresponding to the transmission area.

In an exemplary embodiment of the present invention, the anti-reflection layer includes a second hole corresponding to the transmission area.

In an exemplary embodiment of the present invention, the first hole and the second hole overlap each other.

In an exemplary embodiment of the present invention, the display apparatus further includes an encapsulation substrate arranged on the first surface of the substrate.

In an exemplary embodiment of the present invention, the display apparatus further includes a component arranged on the second surface of the substrate in the component area, wherein the component includes an imaging device or a sensor.

In an exemplary embodiment of the present invention, the display apparatus further including a protection member arranged on the second surface of the substrate in the main display area.

According to an exemplary embodiment of the present invention, a method of manufacturing a display apparatus includes: forming a bottom metal layer on a first surface of a substrate and in a component area of the substrate; forming an encapsulation substrate on the first surface of the substrate; forming a colored material layer on a second surface, opposite to the first surface, of the substrate in the component area; exposing a portion of the colored material layer by irradiating light onto the first surface of the substrate, on which the bottom metal layer is arranged; and forming an anti-reflection layer by developing the exposed portion of the colored material layer.

In an exemplary embodiment of the present invention, in the forming of the colored material layer, the colored material layer is directly formed on the second surface of the substrate.

In an exemplary embodiment of the present invention, in the forming of the colored material layer, the colored material layer includes a positive photosensitive material.

In an exemplary embodiment of the present invention, in the exposing of the portion of the colored material layer, the colored material layer is exposed by using the bottom metal layer as a mask.

In an exemplary embodiment of the present invention, the anti-reflection layer is formed to overlap the bottom metal layer.

In an exemplary embodiment of the present invention, the anti-reflection layer has a first thickness of about 1 µm to about 3 µm.

In an exemplary embodiment of the present invention, the bottom metal layer includes a first hole corresponding to a transmission area of the substrate, wherein the anti-reflection layer includes a second hole corresponding to the transmission area, and the first hole and the second hole overlap each other.

In an exemplary embodiment of the present invention, the method further includes, between the forming of the bottom metal layer and the forming of the encapsulation substrate, forming a first thin film transistor and a first display element in a main display area of the substrate, and forming a second thin film transistor and a second display element on the bottom metal layer in the component area.

In an exemplary embodiment of the present invention, the method further includes, after the forming of the anti-reflection layer, forming a protection member on the second surface of the substrate in the main display area.

BRIEF DESCRIPTION OF THE DRAWINGS

The above and other features of the present invention will become more apparent by describing in detail exemplary embodiments thereof, with reference to the accompanying drawings, in which.

DETAILED DESCRIPTION OF THE EMBODIMENTS

Figure 1:
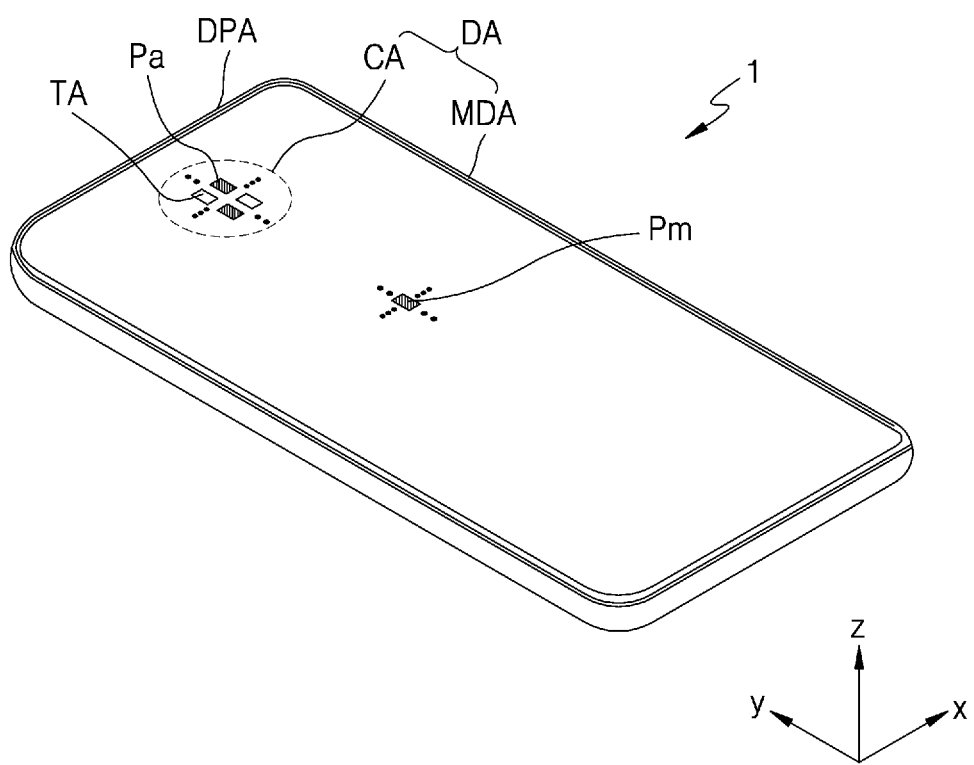
FIG. 1 is a perspective view schematically illustrating a display apparatus according to an exemplary embodiment of the present invention.

Exemplary embodiments of the present invention will now be described more fully with reference to the accompanying drawings. It is to be understood that the present invention may be embodied in different forms and thus should not be construed as being limited to the exemplary embodiments set forth herein. It is to be understood that like reference numerals may refer to like elements throughout the specification, and thus redundant descriptions may be omitted. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

It will be understood that although terms such as "first" and "second" may be used herein to describe various components, these components should not be limited by these terms and these terms are only used to distinguish one component from another component. Thus, a first component discussed below could be termed a second component without departing from the spirit and scope of the present invention.

It will be understood that when a layer, region, or component is referred to as being "on" another layer, region, or component, it may be "directly on" the other layer, region, or component or may be "indirectly on" the other layer, region, or component with one or more intervening layers, regions, or components therebetween.

Sizes of components in the drawings may be exaggerated for clarity. In other words, because the sizes and thicknesses of components in the drawings may be exaggerated for clarity, the present invention is not limited thereto.

As used herein, "A and/or B" represents the case of A, B, or A and B. Also, "at least one of A and B" represents the case of A, B, or A and B.

It will be understood that the meaning of a line "extending in a first direction or a second direction" may include not only extending in a linear shape but also extending in a zigzag or curved shape along a first direction or a second direction.

It will be understood that when referred to as "in a plan view," it may mean that a target portion is viewed from above, and when referred to as "in a cross-sectional view," it may mean that a cross-section of a target portion vertically cut is viewed from side.

Hereinafter, exemplary embodiments of the present invention will be described in detail with reference to the accompanying drawings.

FIG. 1 is a perspective view schematically illustrating a display apparatus according to an exemplary embodiment of the present invention.

Referring to FIG. 1, a display apparatus 1 may include a display area DA and a peripheral area DPA outside the display area DA. The display area DA may include a component area CA and a main display area MDA at least partially surrounding the component area CA. For example, a substrate (e.g., 100 of FIG. 3) of the display apparatus 1 may include the display area DA, the peripheral area DPA, the component area CA and the main display area MDA. For example, each of the component area CA and the main display area MDA may display an image individually or together. The peripheral area DPA may be a type of non-display area in which display elements are not arranged. The display area DA may be at least partially surrounded by the peripheral area DPA. For example, the display area DA may be entirely surround by the peripheral area DPA.

FIG. 1 illustrates that one component area CA is located in the main display area MDA. In an exemplary embodiment of the present invention, the display apparatus 1 may include two or more component areas CA and the shapes and sizes of component areas CA may be different from each other. When viewed in a direction substantially perpendicular to the top surface of the display apparatus 1, the component area CA may have various shapes such as circular shapes, elliptical shapes, polygonal shapes such as tetragonal shapes, star shapes, or diamond shapes. In addition, FIG. 1 illustrates that the component area CA is arranged at the upper center (in the +y direction) of the main display area MDA having a substantially rectangular shape when viewed in a direction substantially perpendicular to the top surface of the display apparatus 1; however, the component area CA may be arranged at one side of the main display area MDA having a rectangular shape, for example, at the upper right side or the upper left side thereof. For example, the component area CA is closer to an upper side of the main display area MDA than a lower side of the main display area MDA.

The display apparatus 1 may provide an image by using a plurality of main subpixels Pm arranged in the main display area MDA and a plurality of auxiliary subpixels Pa arranged in the component area CA.

As described below with reference to FIG. 2, in the component area CA, a component 40, such as an electronic element, may be arranged under the substrate 100 to correspond to the component area CA. For example, the component 40 may include an imaging device, such as a camera using infrared light or visible light. In addition, the component 40 may include a solar cell, a flash, or a sensor, such as an illuminance sensor, a proximity sensor, and an iris sensor. In addition, the component 40 may have a function of receiving sound. For example, the component 40 may be a speaker and/or microphone. To minimize the limitation of the function of the component 40, the component area CA may include a transmission area TA that may transmit light and/or sound output from the component 40 to the outside or propagating toward the component 40 from the outside. In the case of the display apparatus according to an exemplary embodiment of the present invention, when light is transmitted through the component area CA, the light transmittance thereof may be about 10% or more, for example, about 40% or more, about 25% or more, about 50% or more, about 85% or more, or about 90% or more.

A plurality of auxiliary subpixels Pa may be arranged in the component area CA. The plurality of auxiliary subpixels Pa may provide a predetermined image by emitting light. The image displayed in the component area CA may be an auxiliary image and may have a lower resolution than the image displayed in the main display area MDA. For example, the component area CA may include a transmission area TA through which light and sound may be transmitted, and when no subpixel is arranged on the transmission area TA, the number of auxiliary subpixels Pa that may be arranged per unit area therein may be smaller than the number of main subpixels Pm arranged per unit area in the main display area MDA.

Figure 2:
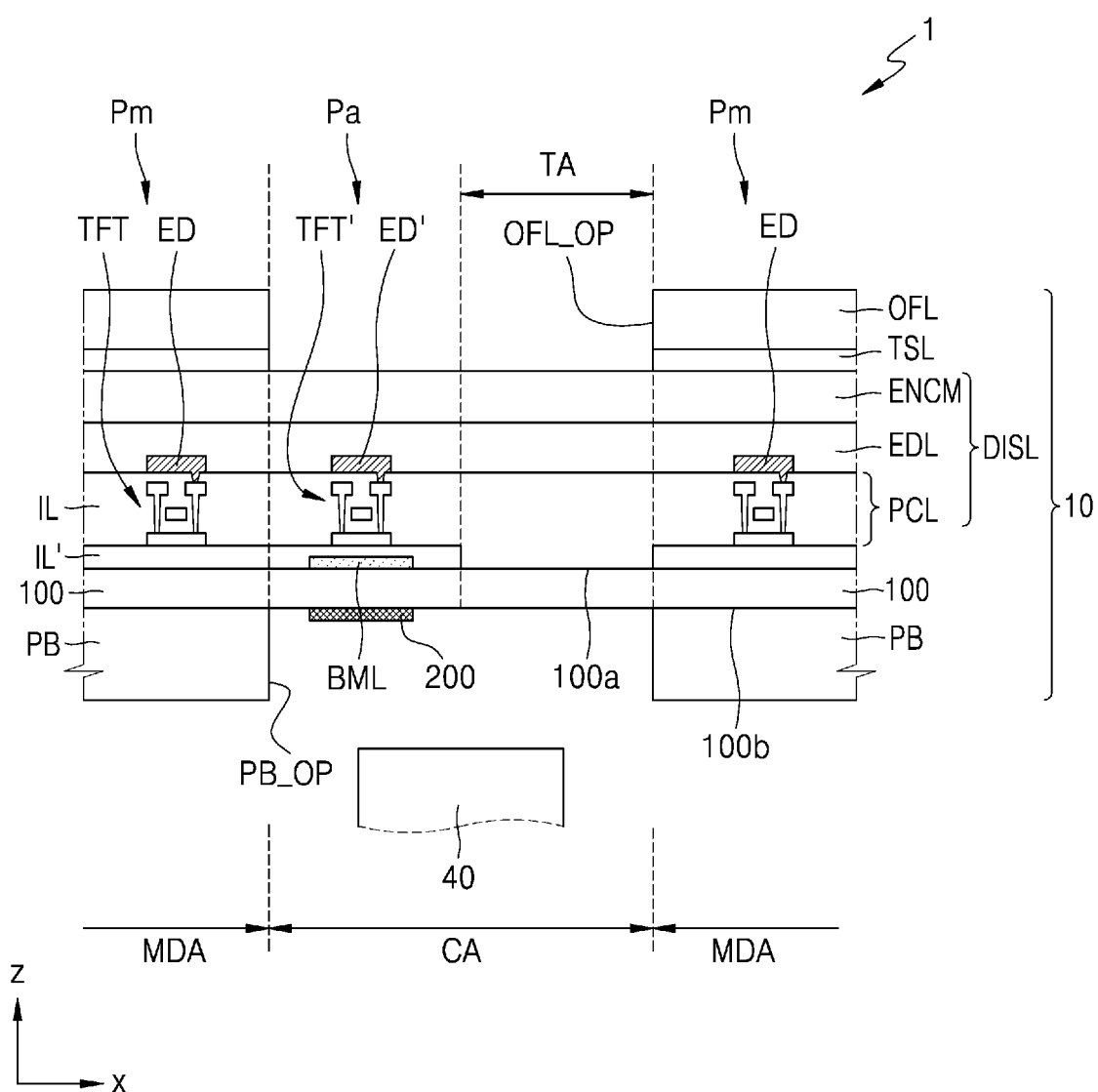
FIG. 2 is a cross-sectional view schematically illustrating a display apparatus according to an exemplary embodiment of the present invention.

FIG. 2 is a cross-sectional view schematically illustrating a display apparatus according to an exemplary embodiment of the present invention.

Referring to FIG. 2, a display apparatus 1 may include a display panel 10 and a component 40 overlapping the display panel 10. A cover window for protecting the display panel 10 may be arranged over the display panel 10.

The display panel 10 may include a component area CA and a main display area MDA where a main image is displayed. Further, the component area CA may overlap the component 40. The display panel 10 may include a substrate 100, a display layer DISL, a touch screen layer TSL, an optical functional layer OFL, and a protection member PB. The display layer DISL may be disposed on the substrate 100, and the protection member PB may be arranged under the substrate 100.

The display layer DISL may include a circuit layer PCL, a display element layer, and an encapsulation member ENCM. The circuit layer PCL may include thin film transistors TFT and TFT', and the display element layer may include light emitting elements ED and ED', which may be display elements. The encapsulation member ENCM may be an encapsulation substrate. Insulating layers IL and IL' may be arranged in the display layer DISL and between the substrate 100 and the display layer DISL.

The substrate 100 may include an insulating material such as glass, quartz, or polymer resin. The substrate 100 may include a rigid substrate or a flexible substrate capable of bending, folding, rolling, or the like.

A main thin film transistor TFT and a main light emitting element ED connected to the main thin film transistor TFT may be arranged in the main display area MDA of the display panel 10 to implement a main subpixel Pm, and an auxiliary thin film transistor TFT' and an auxiliary light emitting element ED' connected to the auxiliary thin film transistor TFT' may be arranged in the component area CA to implement an auxiliary subpixel Pa. An area of the component area CA in which the auxiliary subpixel Pa is arranged may be referred to as an auxiliary display area.

In addition, a transmission area TA in which no display element is arranged may be arranged in the component area CA. The transmission area TA may be an area through which the light/signal output from the component 40 or the light/signal input to the component 40 arranged to correspond to the component area CA is transmitted. The auxiliary display area and the transmission area TA may be alternately arranged in the component area CA.

A bottom metal layer BML may be arranged in the component area CA. The bottom metal layer BML may be arranged to correspond to the bottom of the auxiliary thin film transistor TFT'. For example, the bottom metal layer BML may be arranged between the auxiliary thin film transistor TFT' and the substrate 100. The bottom metal layer BML may block the external light from reaching the auxiliary thin film transistor TFT'. In an exemplary embodiment of the present invention, a constant voltage or signal may be applied to the bottom metal layer BML to prevent damage to a pixel circuit due to an electrostatic discharge.

An anti-reflection layer 200 may be arranged in the component area CA. The anti-reflection layer 200 may be arranged to correspond to the bottom metal layer BML. For example, the bottom metal layer BML and the anti-reflection layer 200 may be arranged to overlap each other with the substrate 100 therebetween. The anti-reflection layer 200 may prevent the light emitted from the component 40 from being reflected by the bottom metal layer BML to cause a flare.

A display element layer EDL may be covered with the encapsulation member ENCM. For example, the encapsulation member ENCM may include an encapsulation substrate. For example, the encapsulation substrate may be arranged to face the substrate 100 with the display element layer EDL therebetween. For example, a gap may be between the encapsulation substrate and the display element layer EDL. The encapsulation substrate may include glass. A sealant including frit or the like may be arranged between the substrate 100 and the encapsulation substrate, and the sealant may be arranged in the peripheral area DPA described above. The sealant arranged in the peripheral area DPA may surround the display area DA to prevent moisture from penetrating through the side surface thereof.

The touch screen layer TSL may be configured to obtain coordinate information according to an external input, for example, a touch event. The touch screen layer TSL may include a touch electrode and touch lines connected to the touch electrode. For example, the touch screen layer TSL may sense an external input by using a self capacitance method or a mutual capacitance method.

The touch screen layer TSL may be arranged on the encapsulation member ENCM. In addition, the touch screen layer TSL may be separately formed on a touch substrate and then coupled onto the encapsulation member ENCM through an adhesive layer such as an optical clear adhesive (OCA). In an exemplary embodiment of the present invention, the touch screen layer TSL may be directly formed on the encapsulation member ENCM, and in this case, an adhesive layer may not be located between the touch screen layer TSL and the encapsulation member ENCM.

In an exemplary embodiment of the present invention, the optical functional layer OFL may include a polarization film. The optical functional layer OFL may include an opening OFL_OP corresponding to the component area CA. Accordingly, the light transmittance of the transmission area TA of the component area CA may be significantly increased. The opening OFL_OP may be filled with a transparent material such as optically clear resin (OCR).

In an exemplary embodiment of the present invention, the optical functional layer OFL may be provided as a filter plate including a black matrix and color filters.

A cover window may be arranged over the display panel 10 to protect the display panel 10. The optical functional layer OFL may be attached to the cover window with an optical clear adhesive or may be attached to the touch screen layer TSL with an optical clear adhesive.

The protection member PB may be attached under the substrate 100 to support and protect the substrate 100. The protection member PB may include an opening PB_OP corresponding to the component area CA. For example, the opening PB_OP may overlap the component area CA.

Because the protection member PB includes the opening PB_OP, the light transmittance of the component area CA may be increased. The protection member PB may include polyethylene terephthalate (PET) or polyimide (PI).

The area of the component area CA may be larger than the area of the component 40. Accordingly, the area of the opening PB_OP included in the protection member PB may not match the area of the component 40. For example, the area of the opening PB_OP may be larger than the area of the component 40.

In addition, a plurality of components 40 may be arranged in the component area CA. The plurality of components 40 may have different functions. For example, the plurality of components 40 may include at least two of a camera (e.g., an imaging device), a solar cell, a flash, a proximity sensor, an illuminance sensor, and an iris sensor.

Figure 3:
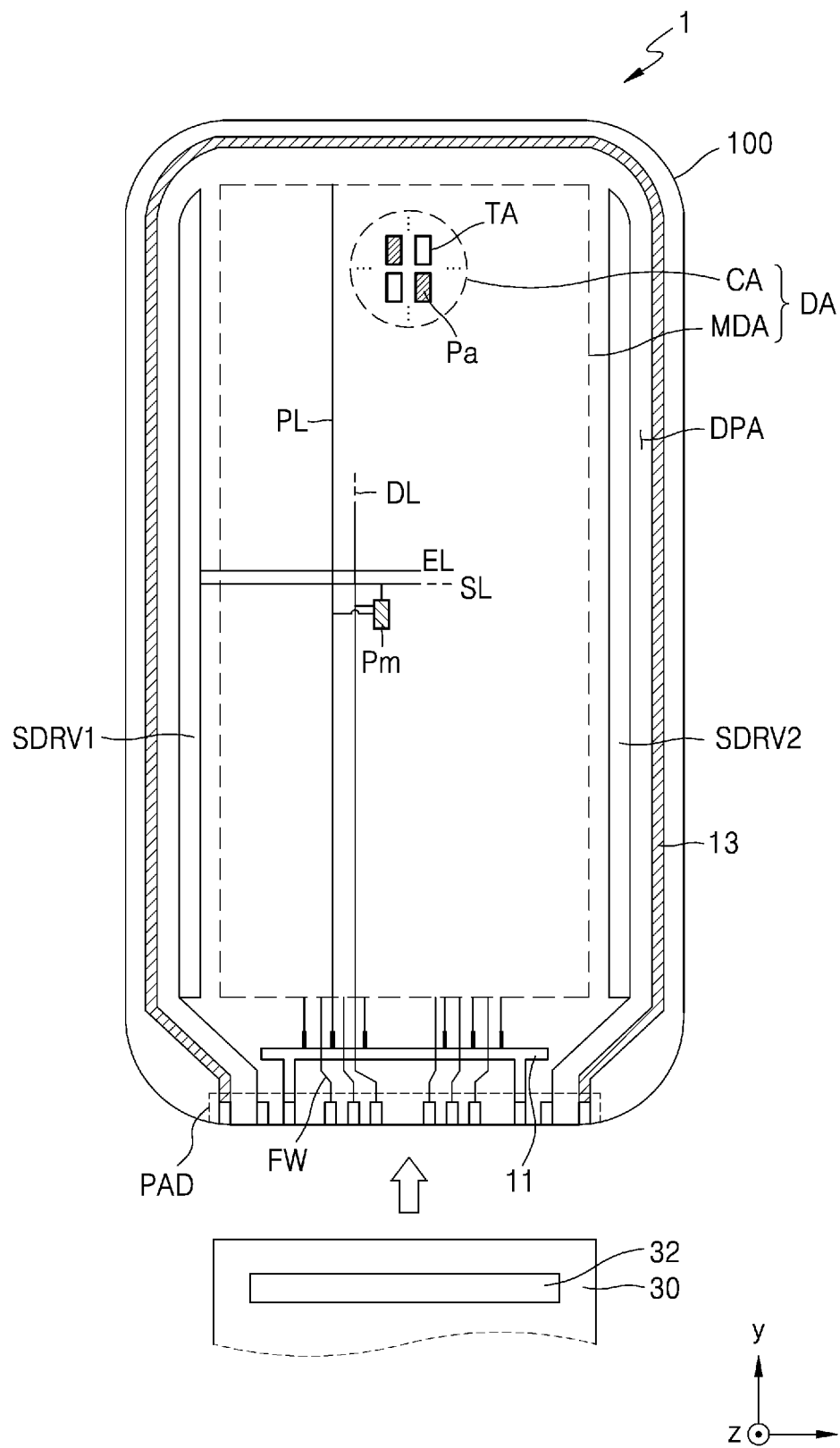
FIG. 3 is a plan view schematically illustrating a display apparatus according to an exemplary embodiment of the present invention.

FIG. 3 is a plan view schematically illustrating a display apparatus according to an exemplary embodiment of the present invention.

Referring to FIG. 3, various components constituting a display apparatus 1 may be arranged on a substrate 100. The substrate 100 may include a display area DA and a peripheral area DPA surrounding the display area DA. The display area DA may include a main display area MDA in which a main image is displayed, and a component area CA which includes a transmission area TA and in which an auxiliary image is displayed. The auxiliary image may form an entire image together with the main image, or the auxiliary image may be an image independent from the main image.

A plurality of main subpixels Pm may be arranged in the main display area MDA. Each of the main subpixels Pm may be implemented by a display element such as an organic light emitting diode (OLED). Each main subpixel Pm may emit, for example, red, green, blue, or white light. The main display area MDA may be covered with an encapsulation member to be protected from external air or moisture.

The component area CA may be located at one side of the main display area MDA as described above or may be arranged inside the display area DA and surrounded by the main display area MDA. A plurality of auxiliary subpixels Pa may be arranged in the component area CA. Each of the plurality of auxiliary subpixels Pa may be implemented by a display element such as an organic light emitting diode (OLED). Each auxiliary subpixel Pa may emit, for example, red, green, blue, or white light. The component area CA may be covered with an encapsulation member to be protected from external air or moisture.

In addition, the component area CA may include a transmission area TA. The transmission area TA may be arranged to surround a plurality of auxiliary subpixels Pa. In addition, the transmission area TA may be arranged in a grid form with a plurality of auxiliary subpixels Pa.

Because the component area CA includes a transmission area TA, the resolution of the component area CA may be lower than the resolution of the main display area MDA. For example, the resolution of the component area CA may be about ½, ⅜, ⅓, ¼, 2/9, ⅛, 1/9, or 1/16 of the resolution of the main display area MDA. For example, the resolution of the main display area MDA may be about 400 ppi or more, and the resolution of the component area CA may be about 200 ppi or about 100 ppi.

Each of the pixel circuits driving the subpixels Pm and Pa may be electrically connected to the peripheral circuits arranged in the peripheral area DPA. A first scan driving circuit SDRV1, a second scan driving circuit SDRV2, a terminal portion PAD, a driving voltage supply line 11, and a common voltage supply line 13 may be arranged in the peripheral area DPA.

The first scan driving circuit SDRV1 may apply a scan signal to each of the pixel circuits driving the subpixels Pm and Pa, through a scan line SL. The first scan driving circuit SDRV1 may apply an emission control signal to each pixel circuit through an emission control line EL. The second scan driving circuit SDRV2 may be located on the opposite side of the first scan driving circuit SDRV1 with respect to the main display area MDA and may be substantially parallel to the first scan driving circuit SDRV1. Some of the pixel circuits of the main subpixels Pm of the main display area MDA may be electrically connected to the first scan driving circuit SDRV1, and the other main pixels Pm may be electrically connected to the second scan driving circuit SDRV2. Some of the pixel circuits of the auxiliary subpixels Pa of the component area CA may be electrically connected to the first scan driving circuit SDRV1, and the other auxiliary subpixels Pa may be electrically connected to the second scan driving circuit SDRV2. However, the present invention is not limited thereto. For example, the second scan driving circuit SDRV2 may be omitted and all of the pixels Pm and Pay may be electrically connected to the first scan driving circuit SDRV1.

The terminal portion PAD may be arranged at one side of the substrate 100. The terminal portion PAD may be exposed by not being covered by an insulating layer, and may be connected to a display circuit board 30. A display driver 32 may be arranged on the display circuit board 30.

The display driver 32 may generate a control signal transmitted to the first scan driving circuit SDRV1 and the second scan driving circuit SDRV2. The display driver 32 may generate a data signal, and the generated data signal may be transmitted to the pixel circuits of the subpixels Pm and Pa through a fan-out line FW and a data line DL connected to the fan-out line FW.

The display driver 32 may supply a driving voltage ELVDD to the driving voltage supply line 11 and may supply a common voltage ELVSS to the common voltage supply line 13. The driving voltage ELVDD may be applied to the pixel circuits of the subpixels Pm and Pa through the driving voltage line PL connected to the driving voltage supply line 11, and the common voltage ELVSS may be supplied to the common voltage supply line 13 to be applied to an opposite electrode of the display element. For example, the opposite electrode may be a common electrode.

The driving voltage supply line 11 may be provided to extend in the x direction under the main display area MDA from a plan view. The common voltage supply line 13 may have a loop shape with one side open, to partially surround the main display area MDA.

Figure 4:
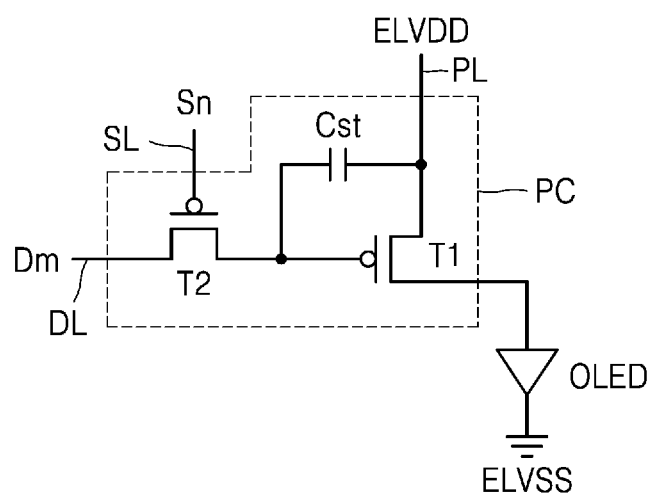
FIGS. 4 and 5 are circuit diagrams of a pixel that may be included in a display apparatus according to an exemplary embodiment of the present invention.
Figure 5:
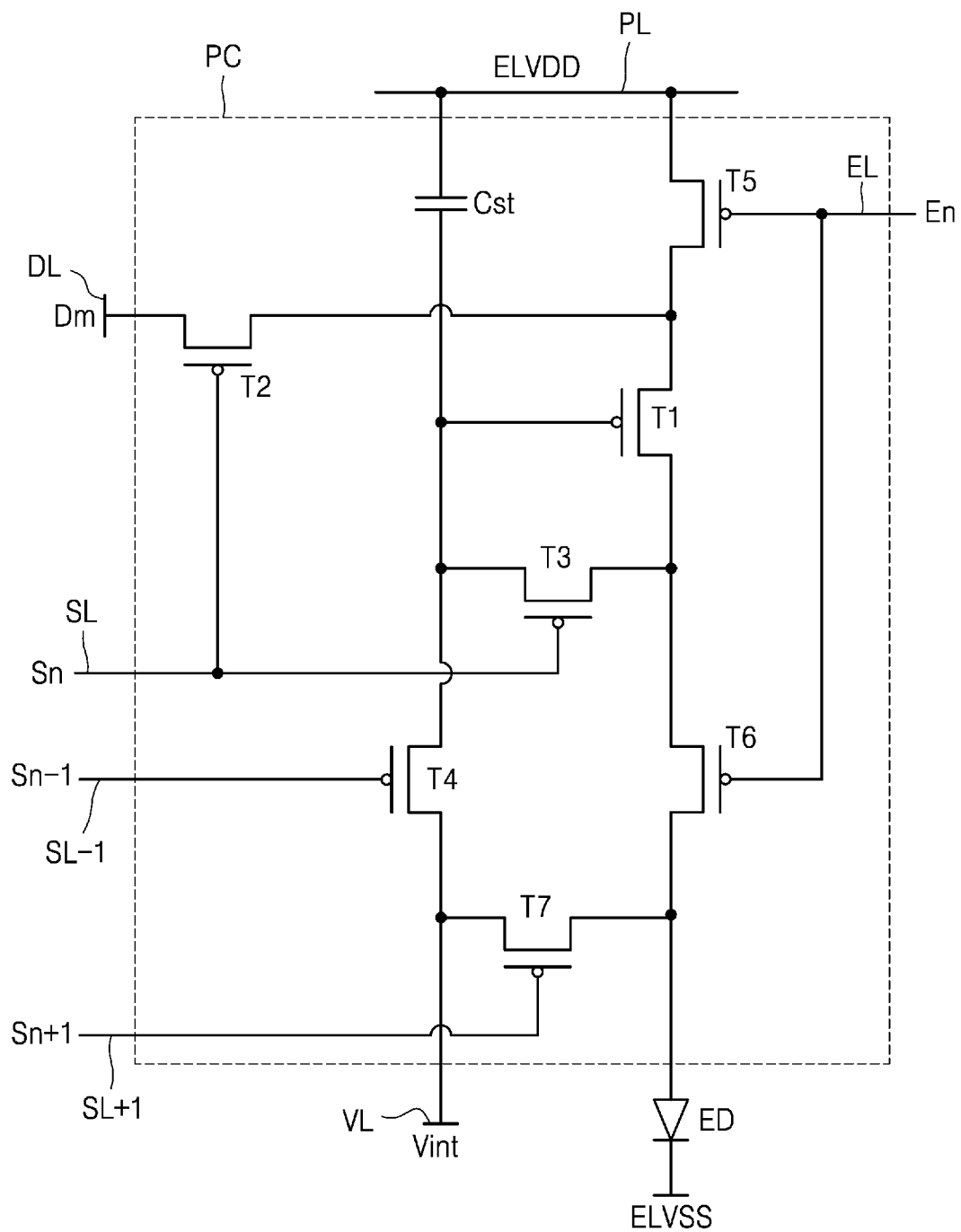

FIGS. 4 and 5 are circuit diagrams of a pixel that may be included in a display apparatus according to an exemplary embodiment of the present invention.

Referring to FIG. 4, a pixel circuit PC may be connected to an organic light emitting diode OLED to implement light emission of subpixels. The pixel circuit PC may include a driving thin film transistor T1, a switching thin film transistor T2, and a storage capacitor Cst. The switching thin film transistor T2 may be connected to a scan line SL and a data line DL, and may be configured to transmit a data signal Dm input through the data line DL to the driving thin film transistor T1 according to a scan signal Sn input through the scan line SL.

The storage capacitor Cst may be connected to the switching thin film transistor T2 and a driving voltage line PL and may store a voltage corresponding to the difference between a voltage received from the switching thin film transistor T2 and a driving voltage ELVDD supplied to the driving voltage line PL.

The driving thin film transistor T1 may be connected to the driving voltage line PL and the storage capacitor Cst and may control a driving current flowing from the driving voltage line PL through the organic light emitting diode OLED in response to a voltage value stored in the storage capacitor Cst. The organic light emitting diode OLED may emit light with a predetermined brightness according to the driving current.

Although FIG. 4 illustrates that the pixel circuit PC includes two thin film transistors and one storage capacitor, the present invention is not limited thereto.

Referring to FIG. 5, a pixel circuit PC may include a driving thin film transistor T1, a switching thin film transistor T2, a compensation thin film transistor T3, a first initialization thin film transistor T4, an operation control thin film transistor T5, an emission control thin film transistor T6, a second initialization thin film transistor T7, and a storage capacitor Cst.

Although FIG. 5 illustrates that each pixel circuit PC includes signal lines SL, SL−1, SL+1, EL, and DL, an initialization voltage line VL, and a driving voltage line PL, the present invention is not limited thereto. In an exemplary embodiment of the present invention, at least one of the signal lines SL, SL−1, SL+1, EL, and DL and/or the initialization voltage line VL may be shared by adjacent pixel circuits.

The drain electrode of the driving thin film transistor T1 may be electrically connected to a light emitting element ED via the emission control thin film transistor T6. The driving thin film transistor T1 may receive a data signal Dm according to a switching operation of the switching thin film transistor T2 and supply a driving current to the light emitting element ED in response to the switching operation.

The gate electrode of the switching thin film transistor T2 may be connected to a scan line SL and the source electrode thereof may be connected to a data line DL. The drain electrode of the switching thin film transistor T2 may be connected to the driving voltage line PL via the operation control thin film transistor T5 while being connected to the source electrode of the driving thin film transistor T1.

The switching thin film transistor T2 may be turned on according to a scan signal Sn received through the scan line SL, to perform a switching operation of transmitting the data signal Dm to the source electrode of the driving thin film transistor T1 through the data line DL.

The gate electrode of the compensation thin film transistor T3 may be connected to the scan line SL. The source electrode of the compensation thin film transistor T3 may be connected to the pixel electrode of the light emitting element ED via the emission control thin film transistor T6 while being connected to the drain electrode of the driving thin film transistor T1. The drain electrode of the compensation thin film transistor T3 may be connected to any one electrode of the storage capacitor Cst, the source electrode of the first initialization thin film transistor T4, and the gate electrode of the driving thin film transistor T1. The compensation thin film transistor T3 may be turned on according to the scan signal Sn received through the scan line SL, to connect the gate electrode and the drain electrode of the driving thin film transistor T1 to each other to diode-connect the driving thin film transistor T1.

The gate electrode of the first initialization thin film transistor T4 may be connected to a previous scan line SL−1.

The drain electrode of the first initialization thin film transistor T4 may be connected to the initialization voltage line VL. The source electrode of the first initialization thin film transistor T4 may be connected to any one electrode of the storage capacitor Cst, the drain electrode of the compensation thin film transistor T3, and the gate electrode of the driving thin film transistor T1. The first initialization thin film transistor T4 may be turned on according to a previous scan signal Sn−1 received through the previous scan line SL−1, to perform an initialization operation of initializing the voltage of the gate electrode of the driving thin film transistor T1 by transmitting an initialization voltage Vint to the gate electrode of the driving thin film transistor T1 through the initialization voltage line VL.

The gate electrode of the operation control thin film transistor T5 may be connected to an emission control line EL. The source electrode of the operation control thin film transistor T5 may be connected to the driving voltage line PL. The drain electrode of the operation control thin film transistor T5 may be connected to the source electrode of the driving thin film transistor T1 and the drain electrode of the switching thin film transistor T2.

The gate electrode of the emission control thin film transistor T6 may be connected to the emission control line EL. The source electrode of the emission control thin film transistor T6 may be connected to the drain electrode of the driving thin film transistor T1 and the source electrode of the compensation thin film transistor T3. The drain electrode of the emission control thin film transistor T6 may be electrically connected to the pixel electrode of the light emitting element ED. The operation control thin film transistor T5 and the emission control thin film transistor T6 may be simultaneously turned on according to an emission control signal En received through the emission control line EL, such that the driving voltage ELVDD may be transmitted to the light emitting element ED and the driving current may flow through the light emitting element ED.

The gate electrode of the second initialization thin film transistor T7 may be connected to a next scan line SL+1. The source electrode of the second initialization thin film transistor T7 may be connected to the pixel electrode of the light emitting element ED. The drain electrode of the second initialization thin film transistor T7 may be connected to the initialization voltage line VL. The second initialization thin film transistor T7 may initialize the pixel electrode of the light emitting element ED by being turned on according to a next scan signal Sn+1 received through the next scan line SL+1.

Although FIG. 5 illustrates a case where the first initialization thin film transistor T4 and the second initialization thin film transistor T7 are respectively connected to the previous scan line SL− and the next scan signal SL+1, the present invention is not limited thereto. In an exemplary embodiment of the present invention, both the first initialization thin film transistor T4 and the second initialization thin film transistor T7 may be connected to the previous scan line SL−1 to be driven according to the previous scan signal Sn−1.

The other electrode of the storage capacitor Cst may be connected to the driving voltage line PL. Any one electrode of the storage capacitor Cst may be connected to the gate electrode of the driving thin film transistor T1, the drain electrode of the compensation thin film transistor T3, and the source electrode of the first initialization thin film transistor T4.

The opposite electrode (e.g., cathode) of the light emitting element ED may be provided with a common voltage ELVSS. The light emitting element ED may emit light by receiving a driving current from the driving thin film transistor T1.

The pixel circuit PC is not limited to the number and circuit design of the thin film transistors and storage capacitor described with reference to FIG. 5, and the number and circuit design thereof may be variously modified. The pixel circuits PC driving the main subpixel Pm and the auxiliary subpixel Pa may be provided in the same manner or may be provided differently from each other.

Figure 6:
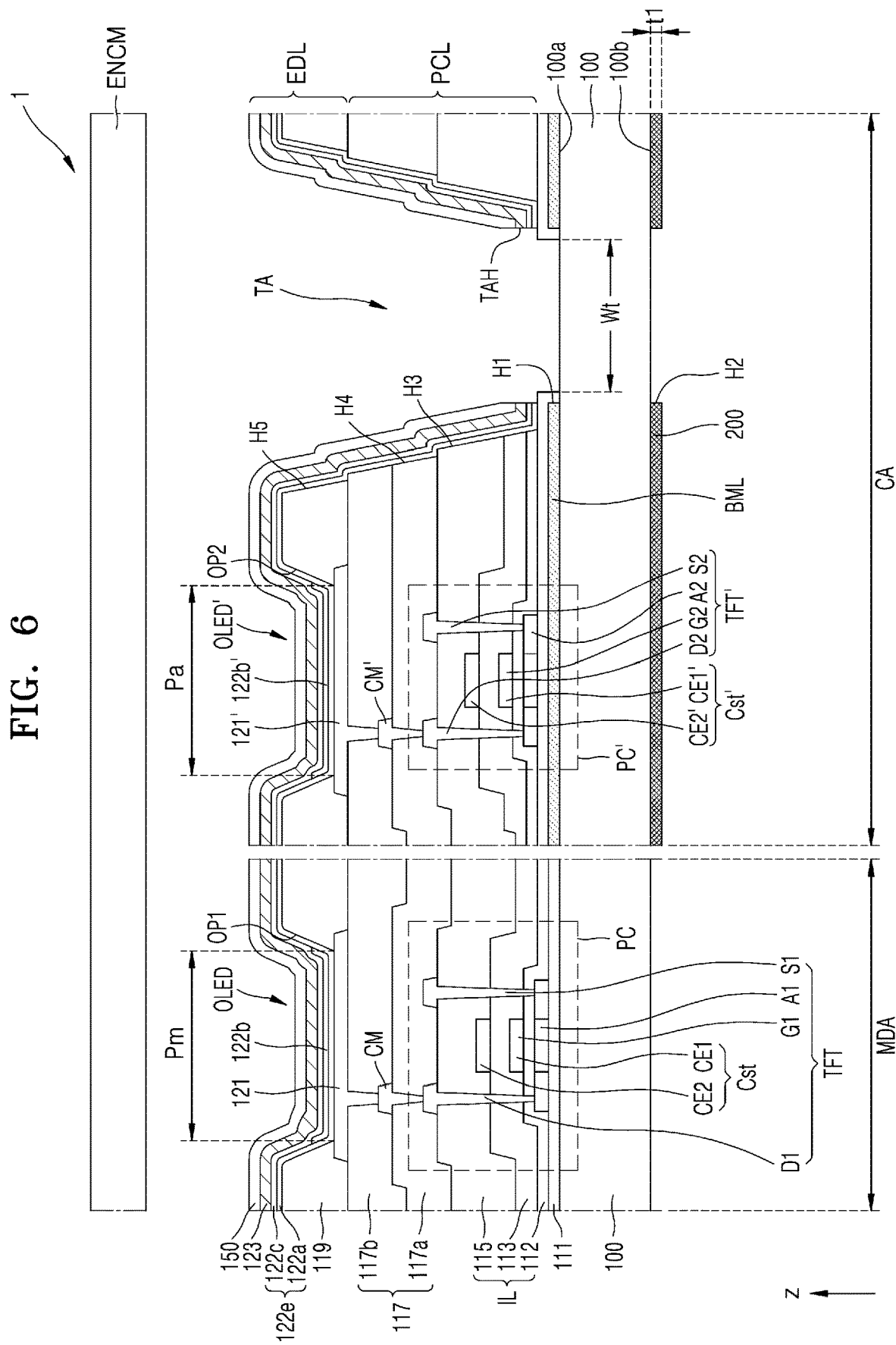
FIG. 6 is a cross-sectional view schematically illustrating a display apparatus according to an exemplary embodiment of the present invention.

FIG. 6 is a cross-sectional view schematically illustrating a display apparatus according to an exemplary embodiment of the present invention. For example, FIG. 6 is a schematic cross-sectional view illustrating a portion of the display apparatus 1 according to an exemplary embodiment of the present invention and is a cross-sectional view schematically illustrating the main display area MDA and the component area CA.

Referring to FIG. 6, a display apparatus 1 may include a main display area MDA and a component area CA. A main subpixel Pm may be arranged in the main display area MDA, and an auxiliary subpixel Pa may be arranged in the component area CA. The component area CA may include a transmission area TA.

A main pixel circuit PC and a main organic light emitting diode OLED may be arranged in the main display area MDA. The main pixel circuit PC may include a main thin film transistor TFT and main storage capacitor Cst, and the main organic light emitting diode OLED may be a display element connected to the main pixel circuit PC. An auxiliary pixel circuit PC' and an auxiliary organic light emitting diode OLED' may be arranged in the component area CA. The auxiliary pixel circuit PC' may include an auxiliary thin film transistor TFT' and an auxiliary storage capacitor Cst', and the auxiliary organic light emitting diode OLED' may be a display element connected to the auxiliary pixel circuit PC'.

In the present embodiment, an organic light emitting diode is used as a display element; however, in an exemplary embodiment of the present invention, an inorganic light emitting element, a quantum dot light emitting element, or the like may be used as a display element.

Hereinafter, a structure in which the components included in the display apparatus 1 are stacked will be described. The display apparatus 1 may include a stack of a substrate 100, a buffer layer 111, a circuit layer PCL, a display element layer EDL, and an encapsulation member ENCM.

As described above, the substrate 100 may include an insulating material such as glass, quartz, or polymer resin. The substrate 100 may include a rigid substrate or a flexible substrate capable of bending, folding, rolling, or the like. For example, the buffer layer 111, the circuit layer PCL, the display element layer EDL, and the encapsulation member ENCM may be stacked on one surface 100a of substrate 100.

The buffer layer 111 may be located on the substrate 100 to reduce or block the penetration of foreign materials, moisture, or external air from the bottom of the substrate 100 and may provide a flat surface on the substrate 100. The buffer layer 111 may include an inorganic material such as oxide or nitride, an organic material, or an organic/inorganic composite and may include a single-layer or multilayer structure of an inorganic material and an organic material. A barrier layer for blocking the penetration of external air may be further included between the substrate 100 and the buffer layer 111. In an exemplary embodiment of the present invention, the buffer layer 111 may include silicon oxide ($SiO_2$) or silicon nitride ($SiN_x$). The buffer layer 111 arranged in the component area CA may include an opening corresponding to the transmission area TA.

In the component area CA, a bottom metal layer BML may be arranged between the substrate 100 and the buffer layer 111. The bottom metal layer BML may be arranged on the one surface 100a of the substrate 100 of the component area CA. For example, the bottom metal layer BML may be directly arranged on one surface 100a of the substrate 100 of the component area CA. In an exemplary embodiment of the present invention, a buffer layer may be located between the bottom metal layer BML and one surface 100a of the substrate 100. The bottom metal layer BML may be arranged under the auxiliary pixel circuit PC' to prevent the degradation of the characteristics of the auxiliary thin film transistor TFT' by the light emitted from a component or the like. In addition, the bottom metal layer BML may prevent the light emitted from the component or the like or light directed to the component from diffracting through a narrow gap between the lines connected to the auxiliary pixel circuit PC'. The bottom metal layer BML may not be in the transmission area TA.

The bottom metal layer BML may be connected through a contact hole to a bias line arranged in another layer. The bottom metal layer BML may receive a constant voltage or a signal from the bias line. For example, the bottom metal layer BML may receive a bias voltage. The bias voltage may have a different level than the driving voltage ELVDD. However, the present invention is not limited thereto. For example, the bias voltage may have the same level as the driving voltage ELVDD.

By receiving the bias voltage, the bottom metal layer BML may significantly reduce the probability of occurrence of an electrostatic discharge. The bottom metal layer BML may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu). The bottom metal layer BML may be provided as a single layer or a multiple layer of the above material.

The bottom metal layer BML of the component area CA may be provided to correspond to the component area CA. For example, the bottom metal layer BML may correspond to the entire component area CA. In this case, the bottom metal layer BML may include a first hole H1 corresponding to the transmission area TA. In an exemplary embodiment of the present invention, the shape and size of the transmission area TA may be formed by the shape and size of the first hole H1 formed by the bottom metal layer BML.

In an exemplary embodiment of the present invention, the bottom metal layer BML may not arranged in the main display area MDA. When the bottom metal layer BML is provided at a front surface of the substrate 100 or at a corresponding portion thereof, a defect may occur in the process of crystallizing a semiconductor layer A1 of the thin film transistor TFT by using a laser.

In the present embodiment, the bottom metal layer BML may be arranged to correspond to the component area CA such that a process defect rate may be reduced. For example, the bottom metal layer BML may be disposed only in the component area CA, and the process defect rate may be reduced.

In the component area CA, an anti-reflection layer 200 may be arranged on the substrate 100. For example, the anti-reflection layer 200 may arranged under the substrate 100. For example, in the component area CA, the anti-reflection layer 200 may be arranged on the other surface 100b of the substrate 100, opposite to one surface 100a of the substrate 100, to overlap the bottom metal layer BML arranged on the one surface 100a of the substrate 100. For example, the anti-reflection layer 200 may be directly arranged on the other surface 100b of the substrate 100.

The anti-reflection layer 200 may overlap the bottom metal layer BML with the substrate 100 therebetween. In an exemplary embodiment of the present invention, the width of the bottom metal layer BML may be smaller than the width of the anti-reflection layer 200, and thus, the bottom metal layer BML may entirely overlap the anti-reflection layer 200 when projected in a direction perpendicular to the substrate 100.

Because the anti-reflection layer 200 is arranged to overlap the bottom metal layer BML, it may be possible to prevent the occurrence of a flare. For example, because the anti-reflection layer 200 is arranged to overlap the bottom metal layer BML, it may be possible to prevent a flare from occurring because the light emitted from the component 40 (see FIG. 2) is reflected by the bottom metal layer BML.

The anti-reflection layer 200 may include a colored material. For example, the anti-reflection layer 200 may include a colored pigment, for example, a pigment of a certain color such as white or black. In an exemplary embodiment of the present invention, the anti-reflection layer 200 may have a black color. For example, the anti-reflection layer 200 may include a polyimide (PI)-based binder and a pigment in which red, green, and blue colors are mixed. In addition, the anti-reflection layer 200 may include a cardo-based binder resin and a mixture of lactam-based black pigment and blue pigment. In addition, the anti-reflection layer 200 may include a carbon black or a light blocking material. The anti-reflection layer 200 may include a positive photosensitive material because it is formed from a colored material layer 200M (see FIG. 11) described below.

Because the anti-reflection layer 200 includes a colored pigment, a carbon black or a light blocking material, the reflection of external light may be prevented. In addition, the contrast of the display apparatus may be increased, and the occurrence of a flare may be prevented.

The anti-reflection layer 200 may have a first thickness t1 in the z-direction and may be arranged on the other surface 100b of the substrate 100. For example, the first thickness t1 may be about 0.5 μm to about 5 μm or about 0.5 μm to about 4 μm and may have various modifications such as about 1 μm to about 4 μm. For example, the first thickness t1 may be about 1 μm to about 3 μm.

The anti-reflection layer 200 of the component area CA may be provided to correspond to the entire component area CA. The anti-reflection layer 200 may include a second hole H2 corresponding to the transmission area TA. The second hole H2 formed in the anti-reflection layer 200 may overlap the first hole H1 formed in the bottom metal layer BML. For example, the second hole H2 formed in the anti-reflection layer 200 and the first hole H1 formed in the bottom metal layer BML may overlap each other with the substrate 100 therebetween. In an exemplary embodiment of the present invention, the second hole H2 of the anti-reflection layer 200 may be equal to or narrower than the first hole H1 of the bottom metal layer BML.

The circuit layer PCL may be arranged on the buffer layer 111 and may include the pixel circuits PC and PC', a first insulating layer 112, a second insulating layer 113, a third insulating layer 115, and a planarization layer 117. The main pixel circuit PC may include a main thin film transistor TFT and a main storage capacitor Cst, and the auxiliary pixel circuit PC' may include an auxiliary thin film transistor TFT' and an auxiliary storage capacitor Cst'.

The main thin film transistor TFT and the auxiliary thin film transistor TFT' may be arranged on the buffer layer 111. The main thin film transistor TFT may include a first semiconductor layer A1, a first gate electrode G1, a first source electrode S1, and a first drain electrode D1, and the auxiliary thin film transistor TFT' may include a second semiconductor layer A2, a second gate electrode G2, a second source electrode S2, and a second drain electrode D2. The main thin film transistor TFT may be connected to the main organic light emitting diode OLED to drive the main organic light emitting diode OLED. The auxiliary thin film transistor TFT' may be connected to the auxiliary organic light emitting diode OLED' to drive the auxiliary organic light emitting diode OLED'.

The first semiconductor layer A1 and the second semiconductor layer A2 may be arranged on the buffer layer 111 and may include polysilicon. In an exemplary embodiment of the present invention, the first semiconductor layer A1 and the second semiconductor layer A2 may include amorphous silicon. In an exemplary embodiment of the present invention, the first semiconductor layer A1 and the second semiconductor layer A2 may include an oxide of at least one of indium (in), gallium (Ga), tin (Sn), zirconium (Zr), vanadium (V), hafnium (Hf), cadmium (Cd), germanium (Ge), chromium (Cr), titanium (Ti), and/or zinc (Zn). The first semiconductor layer A1 and the second semiconductor layer A2 may include a channel area, a source area and a drain area that are doped with dopants.

The second semiconductor layer A2 may overlap the bottom metal layer BML with the buffer layer 111 therebetween. In an exemplary embodiment of the present invention, the width of the second semiconductor layer A2 may be smaller than the width of the bottom metal layer BML, and thus, the second semiconductor layer A2 may be entirely overlapped by the bottom metal layer BML when projected in the direction perpendicular to the substrate 100.

The first insulating layer 112 may cover the first semiconductor layer A1 and the second semiconductor layer A2. The first insulating layer 112 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), and hafnium oxide ($HfO_2$), or zinc oxide ($ZnO_2$). The first insulating layer 112 may include a single layer or a multiple layer including the above inorganic insulating material.

The first gate electrode G1 and the second gate electrode G2 may be arranged on the first insulating layer 112 to respectively overlap the first semiconductor layer A1 and the second semiconductor layer A2. The first gate electrode G1 and the second gate electrode G2 may include, for example, molybdenum (Mo), aluminum (Al), copper (Cu), titanium (Ti), or the like and may include a single layer or a multiple layer. In an exemplary embodiment of the present invention, the first gate electrode G1 and the second gate electrode G2 may each include a molybdenum (Mo) and may each be a single layer.

The second insulating layer 113 may cover the first gate electrode G1 and the second gate electrode G2. The second insulating layer 113 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), and hafnium oxide ($HfO_2$), and/or zinc oxide ($ZnO_2$). The second insulating layer 113 may include a single layer or a multiple layer including the above inorganic insulating material.

A first upper electrode CE2 of the main storage capacitor Cst and a second upper electrode CE2' of the auxiliary storage capacitor Cst may be arranged on the second insulating layer 113.

In the main display area MDA, the first upper electrode CE2 may overlap the first gate electrode G1 arranged thereunder. The first gate electrode G1 and the first upper electrode CE2 overlapping each other with the second insulating layer 113 therebetween may constitute the main storage capacitor Cst. The first gate electrode G1 may be integrally provided with a first lower electrode CE1 of the main storage capacitor Cst. In an exemplary embodiment of the present invention, the main storage capacitor Cst may not overlap the main thin film transistor TFT, and the first lower electrode CE1 of the main storage capacitor Cst may be a separate independent component from the first gate electrode G1 of the main thin film transistor TFT.

In the component area CA, the second upper electrode CE2' may overlap the second gate electrode G2 arranged thereunder. The second gate electrode G2 and the second upper electrode CE2' overlapping each other with the second insulating layer 113 therebetween may constitute the auxiliary storage capacitor CSt'. The second gate electrode G2 may be integrally provided with a second lower electrode CE1' of the auxiliary storage capacitor Cst'. In an exemplary embodiment of the present invention, the auxiliary storage capacitor Cst' may not overlap the auxiliary thin film transistor TFT', and the second lower electrode CE1' of the auxiliary storage capacitor Cst' may be a separate independent component from the second gate electrode G2 of the auxiliary thin film transistor TFT'.

The first upper electrode CE2 and the second upper electrode CE2' may include, for example, aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu) and may include a single layer or a multiple layer of the above material.

The third insulating layer 115 may be formed to cover the first upper electrode CE2 and the second upper electrode CE2'. The third insulating layer 115 may include, for example, silicon oxide ($SiO_2$), silicon nitride ($SiN_x$), silicon oxynitride (SiON), aluminum oxide ($A_2O_3$), titanium oxide ($TiO_2$), tantalum oxide ($Ta_2O_5$), and hafnium oxide ($HfO_2$), and/or zinc oxide ($ZnO_2$). The third insulating layer 115 may include a single layer or a multiple layer including the above inorganic insulating material.

When the first insulating layer 112, the second insulating layer 113, and the third insulating layer 115 are collectively referred to as an inorganic insulating layer IL, the inorganic insulating layer IL may have a third hole H3 corresponding to the transmission area TA. The third hole H3 may expose a portion of the top surface of the substrate 100. In addition, when the buffer layer 111 is arranged in the transmission area TA, the third hole H3 may expose a portion of the top surface of the buffer layer 111. The third hole H3 may be formed of an opening of the first insulating layer 112, an opening of the second insulating layer 113, and an opening of the third insulating layer 115 to correspond to the transmission area TA, and the opening of the first insulating layer 112, the opening of the second insulating layer 113, and the opening of the third insulating layer 115 may overlap each other. The openings may be separately formed through separate processes or may be simultaneously formed through the same process. For example, when the openings are formed in separate processes, the inner surface of the third hole H3 may not be smooth and may have a stair-shaped step or an uneven surface.

The source electrodes S1 and S2 and the drain electrodes D1 and D2 may be arranged on the third insulating layer 115. The source electrodes S1 and S2 and the drain electrodes D1 and D2 may include a conductive material including, for example, molybdenum (Mo), aluminum (Al), copper (Cu), titanium (Ti), or the like and may include a single layer or a multiple layer including the above material. For example, the source electrodes S1 and S2 and the drain electrodes D1 and D2 may include a multilayer structure of Ti/Al/Ti.

The planarization layer 117 may be arranged to cover the source electrodes S1 and S2 and the drain electrodes D1 and D2. The planarization layer 117 may have a flat top surface such that a first pixel electrode 121 and a second pixel electrode 121' arranged on the planarization layer 117 may be formed on a flat surface.

The planarization layer 117 may include an organic material or an inorganic material and may have a single-layer structure or a multilayer structure. The planarization layer 117 may include a first planarization layer 117a and a second planarization layer 117b. Accordingly, a conductive pattern such as a line may be formed between the first planarization layer 117a and the second planarization layer 117b, which may increase integration.

The planarization layer 117 may include a general-purpose polymer such as benzocyclobutene (BCB), polyimide, hexamethyldisiloxane (HMDSO), polymethylmethacrylate (PMMA), or polystyrene (PS), a polymer derivative having a phenolic group, an acrylic polymer, an imide-based polymer, an arylether-based polymer, an amide-based polymer, a fluorine-based polymer, a p-xylene-based polymer, or a vinyl alcohol-based polymer. In addition, the planarization layer 117 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), and hafnium oxide ($HfO_2$), or zinc oxide ($ZnO_2$). When the planarization layer 117 is formed, after a layer is formed, chemical mechanical polishing may be performed on a top surface of the layer to provide a flat top surface.

The first planarization layer 117a may be arranged to cover the pixel circuits PC and PC'. The second planarization layer 117b may be arranged on the first planarization layer 117a and may have a flat top surface such that the pixel electrodes 121 and 121' may be formed flat when formed on the second planarization layer 117b.

The organic light emitting diodes OLED and OLED' may be arranged on the second planarization layer 117b. The pixel electrodes 121 and 121' of the organic light emitting diodes OLED and OLED' may be respectively connected to the pixel circuits PC and PC' through respective connection electrodes CM and CM' arranged on the planarization layer 117.

The connection electrodes CM and CM' may be arranged between the first planarization layer 117a and the second planarization layer 117b. The connection electrodes CM and CM' may include a conductive material including, for example, molybdenum (Mo), aluminum (Al), copper (Cu), titanium (Ti), or the like and may include a single layer or a multiple layer including the above material. For example, the connection electrodes CM and CM' may include a multilayer structure of T/Al/Ti.

The planarization layer 117 may include a fourth hole H4 corresponding to the transmission area TA. The fourth hole H4 may overlap the third hole H3. FIG. 6 illustrates that the fourth hole H4 is larger than the third hole H3. In exemplary embodiment of the present invention, the planarization layer 117 may be provided to cover the edge of the third hole H3 of the inorganic insulating layer IL such that the area of the fourth hole H4 may be smaller than the area of the third hole H3.

The planarization layer 117 may include a via hole for exposing any one of the first source electrode S1 and the first drain electrode D1 of the main thin film transistor TFT, and the first pixel electrode 121 may be electrically connected to the main thin film transistor TFT by contacting the first source electrode S1 or the first drain electrode D1 of the main thin film transistor TFT through the via hole. In addition, the planarization layer 117 may include a via hole for exposing any one of the second source electrode S2 and the second drain electrode D2 of the auxiliary thin film transistor TFT', and the second pixel electrode 121' may be electrically connected to the auxiliary thin film transistor TFT' by contacting the second source electrode S2 or the second drain electrode D2 of the auxiliary thin film transistor TFT' through the via hole.

The first pixel electrode 121 and the second pixel electrode 121' may include a conductive oxide such as indium tin oxide (ITO), indium zinc oxide (IZO), zinc oxide (ZnO), indium oxide ($In_2O$), indium gallium oxide (IGO), or aluminum zinc oxide (AZO). The first pixel electrode 121 and the second pixel electrode 121' may include a reflection layer including, for example, silver (Ag), magnesium (Mg), aluminum (Al), platinum (Pt), palladium (Pd), gold (Au), nickel (Ni), neodymium (Nd), iridium (Ir), chromium (Cr), or any compound thereof. For example, the first pixel electrode 121 and the second pixel electrode 121' may have a structure including layers formed of ITO, IZO, ZnO, or $In_2O_3$ over/under the reflection layer. In this case, the first pixel electrode 121 and the second pixel electrode 121' may have a stack structure of ITO/Ag/ITO.

A pixel definition layer 119 may cover the edges of the first pixel electrode 121 and the second pixel electrode 121' on the planarization layer 117 and may include a first opening OP and a second opening OP2 for exposing the center portions of the first pixel electrode 121 and the second pixel electrode 121'. The first opening OP1 and the second opening OP2 may provide the emission areas of the organic light emitting diodes OLED and OLED', for example, the sizes and shapes of the subpixels Pm and Pa.

The pixel definition layer 119 may increase the distance between the edge of the pixel electrodes 121 and 121' and an opposite electrode 123 disposed on the pixel electrodes 121 and 121' to prevent an arc or the like from occurring at the edge of the pixel electrodes 121 and 121'. The pixel definition layer 119 may be formed of an organic insulating material such as polyimide, polyamide, acrylic resin, benzocyclobutene, hexamethyldisiloxane (HMDSO), or phenol resin by spin coating or the like.

The pixel definition layer 119 may include a fifth hole H5 located in the transmission area TA. The fifth hole H5 may overlap the third hole H3 and the fourth hole H4. The light transmittance in the transmission area TA may be increased by the third hole H3 to the fifth hole H5. A portion of the opposite electrode 123 described below may be arranged at the inner surface of the third hole H3 to the fifth hole H5.

A first emission layer 122b and a second emission layer 122b', which are formed to correspond respectively to the first pixel electrode 121 and the second pixel electrode 121', may be respectively arranged inside the first opening OP and the second opening OP2 of the pixel definition layer 119. For example, the first emission layer 122b and the second emission layer 122b' may include a high molecular weight material or a low molecular weight material and may emit red, green, blue, or white light.

An organic functional layer 122e may be arranged over and/or under the first emission layer 122b and the second emission layer 122b'. The organic functional layer 122e may include a first functional layer 122a and/or a second functional layer 122c. However, the present invention is not limited thereto. For example, the first functional layer 122a or the second functional layer 122c may be omitted, or a third functional layer may be provided.

The first functional layer 122a may be arranged under the first emission layer 122b and the second emission layer 122b'. The first functional layer 122a may include a single layer or a multiple layer including an organic material. The first functional layer 122a may include a hole transport layer (HTL) having a single-layer structure. In addition, the first functional layer 122a may include a hole injection layer (HIL) and a hole transport layer (HTL). The first functional layer 122a may be integrally formed to correspond to the organic light emitting diodes OLED and OLED' included in the main display area MDA and the component area CA.

The second functional layer 122c may be arranged over the first emission layer 122b and the second emission layer 122b'. The second functional layer 122c may include a single layer or a multiple layer including an organic material. The second functional layer 122c may include an electron transport layer (ETL) and/or an electron injection layer (EIL). The second functional layer 122c may be integrally formed to correspond to the organic light emitting diodes OLED and OLED' included in the main display area MDA and the component area CA.

The opposite electrode 123 may be arranged over the second functional layer 122c. The opposite electrode 123 may include a conductive material having a low work function. For example, the opposite electrode 123 may include a (semi)transparent layer including, for example, silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or any alloy thereof. In addition, the opposite electrode 123 may further include a layer such as ITO, IZO, ZnO, or $In_2O$ on the (semi)transparent layer including the above material. The opposite electrode 123 may be integrally formed to correspond to the organic light emitting diodes OLED and OLED' included in the main display area MDA and the component area CA.

The first pixel electrode 121, the organic functional layer 122e and the opposite electrode 123 formed in the main display area MDA may constitute the main organic light emitting diode OLED. The second pixel electrode 121', the organic functional layer 122e and the opposite electrode 123 formed in the component area CA may constitute the auxiliary organic light emitting diode OLED'.

A top layer 150 including an organic material may be formed on the opposite electrode 123. The top layer 150 may be provided to protect the opposite electrode 123 and increase light extraction efficiency. For example, the top layer 150 may include an organic material having a higher refractive index than the opposite electrode 123. In addition, the top layer 150 may include a stack of layers having different refractive indexes from each other. For example, the top layer 150 may include a stack of a high refractive index layer, a low refractive index layer, and a high refractive index layer. For example, the refractive index of the high refractive index layer may be about 1.7 or more, and the refractive index of the low refractive index layer may be about 1.3 or less. For example, the top layer 150 may further include LiF. In addition, the top layer 150 may further include an inorganic insulating material such as silicon oxide ($SiO_2$) or silicon nitride ($SiN_x$). In an exemplary embodiment of the present invention, the top layer 150 may be omitted.

The first functional layer 122a, the second functional layer 122c, the opposite electrode 123, and the top layer 150 may include a transmission hole TAH corresponding to the transmission area TA. For example, the first functional layer 122a, the second functional layer 122c, the opposite electrode 123, and the top layer 150 may include openings corresponding to the transmission area TA. The areas of the openings of the first functional layer 122a, the second functional layer 122c, the opposite electrode 123, and the top layer 150 may be substantially equal to each other. For example, the area of the opening of the opposite electrode 123 may be substantially equal to the area of the transmission hole TAH.

48 For example, the transmission hole TAH overlaps the transmission area TA. In this case, the area of the transmission hole TAH may be smaller than the area of the third hole H3 formed in the inorganic insulating layer IL. The smallest width Wt of the transmission area TA may be smaller than the width of the transmission hole TAH. In an exemplary embodiment of the present invention, the smallest width Wt of the transmission area TA may be equal to the width of the transmission hole TAH. Although FIG. 6 illustrates that the opening formed in the buffer layer 111 corresponds to the smallest width Wt of the transmission area TA, the opening formed in the first functional layer 122a, the second functional layer 122c, the opposite electrode 123, and the top layer 150 may correspond to the smallest width Wt of the transmission area TA.

Due to the transmission hole TAH, a portion of the opposite electrode 123 may not be in the transmission area TA, and accordingly, the light transmittance in the transmission area TA may be significantly increased. The opposite electrode 123 including the transmission hole TAH may be formed in various ways. In an exemplary embodiment of the present invention, a material for forming the opposite electrode 123 may be formed on the front surface of the substrate 100, and a portion of the material corresponding to the transmission area TA may be removed by laser lift-off to form the opposite electrode 123 including the transmission hole TAH. In an exemplary embodiment of the present invention, the opposite electrode 123 including the transmission hole TAH may be formed through a metal self patterning (MSP) process. In an exemplary embodiment of the present invention, the opposite electrode 123 including the transmission hole TAH may be formed by depositing the opposite electrode 123 by using a fine metal mask (FMM).

The main organic light emitting diode OLED of the main display area MDA and the auxiliary organic light emitting diode OLED' of the component area CA may be covered with the encapsulation member ENCM. For example, the encapsulation member ENCM may include an encapsulation substrate. The encapsulation substrate may be arranged to face the substrate 100, and a gap may be between the encapsulation substrate and the display element layer EDL. The encapsulation substrate may include glass. A sealant including frit or the like may be arranged between the substrate 100 and the encapsulation substrate, and the sealant may be arranged in the peripheral area DPA described above. The sealant arranged in the peripheral area DPA may surround the display area DA to prevent moisture from penetrating through the side surface thereof.

FIGS. 7 to 13 are cross-sectional views schematically illustrating a method of manufacturing a display apparatus according to an exemplary embodiment of the present invention.

Hereinafter, a method of manufacturing a display apparatus will be sequentially described with reference to FIGS. 7 to 13.

As a method of manufacturing a display apparatus according to an exemplary embodiment of the present invention, a method of manufacturing a display apparatus including a main display area MDA, a component area CA including a transmission area TA, and a peripheral area around the main display area MDA may include forming a bottom metal layer BML on one surface 100a of a substrate 100 to correspond to the component area CA, forming an encapsulation substrate on the one surface 100a of the substrate 100, forming a colored material layer 200M on another surface 100b opposite to the one surface 100a of the substrate 100 to correspond to the component area CA, exposing a portion of the colored material layer 200M by irradiating light onto the one surface 100a of the substrate 100 with the bottom metal layer BML arranged thereon, and forming an anti-reflection layer 200 by developing the exposed colored material layer.

Between the forming of the bottom metal layer BML and the forming of the encapsulation substrate, the method may further include forming a main thin film transistor TFT and a main display element on the one surface 100a of the substrate 100 to correspond to the main display area MDA. In addition, the method may further include forming an auxiliary thin film transistor TFT' and an auxiliary display element on the bottom metal layer BML to correspond to the component area CA. In addition, after the forming of the anti-reflection layer 200, the method may further include forming a protection member PB on the other surface 100b of the substrate 100 to correspond to the main display area MDA.

Figure 7:
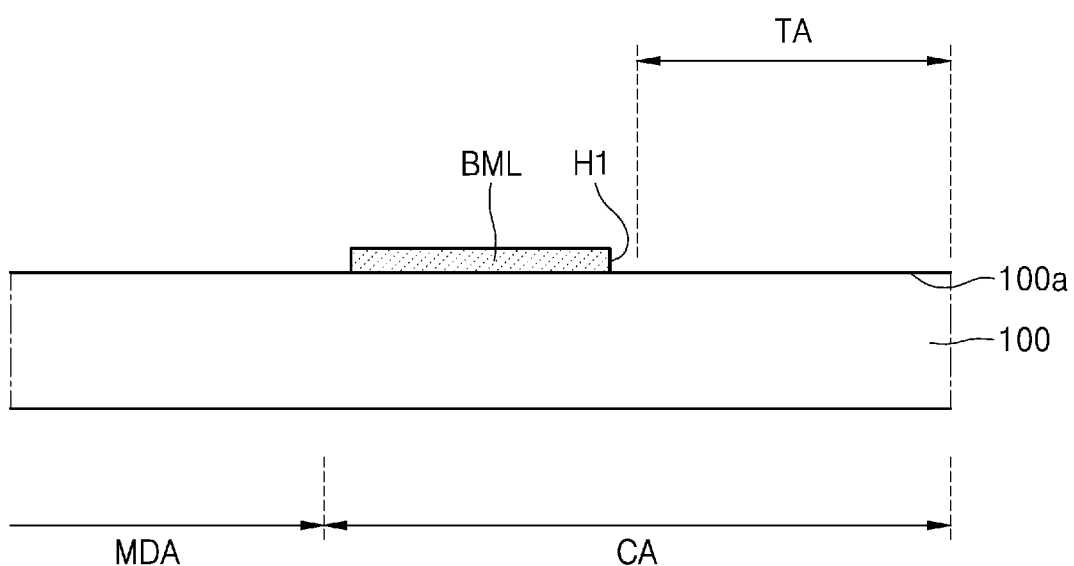
FIGS. 7, 8, 9, 10, 11, 12 and 13 are cross-sectional views schematically illustrating a method of manufacturing a display apparatus according to an exemplary embodiment of the present invention.

Referring to FIG. 7, in the forming of the bottom metal layer BML on the one surface 100a of the substrate 100 to correspond to the component area CA, the bottom metal layer BML may be formed on the one surface 100a of the substrate 100 including glass. The bottom metal layer BML may be arranged to correspond to the bottom of the auxiliary thin film transistor TFT' described below. For example, the bottom metal layer BML may overlap the auxiliary thin film transistor TFT'. For example, the bottom metal layer BML may be arranged between the auxiliary thin film transistor TFT' and the substrate 100.

The bottom metal layer BML of the component area CA may be formed to correspond to the component area CA. For example, the entirety of the bottom metal layer BML may be disposed in the component area CA. The bottom metal layer BML may include a first hole H1 corresponding to the transmission area TA. In an exemplary embodiment of the present invention, the shape and size of the transmission area TA may be formed by the shape and size of the first hole H1 formed in the bottom metal layer BML.

Figure 8:
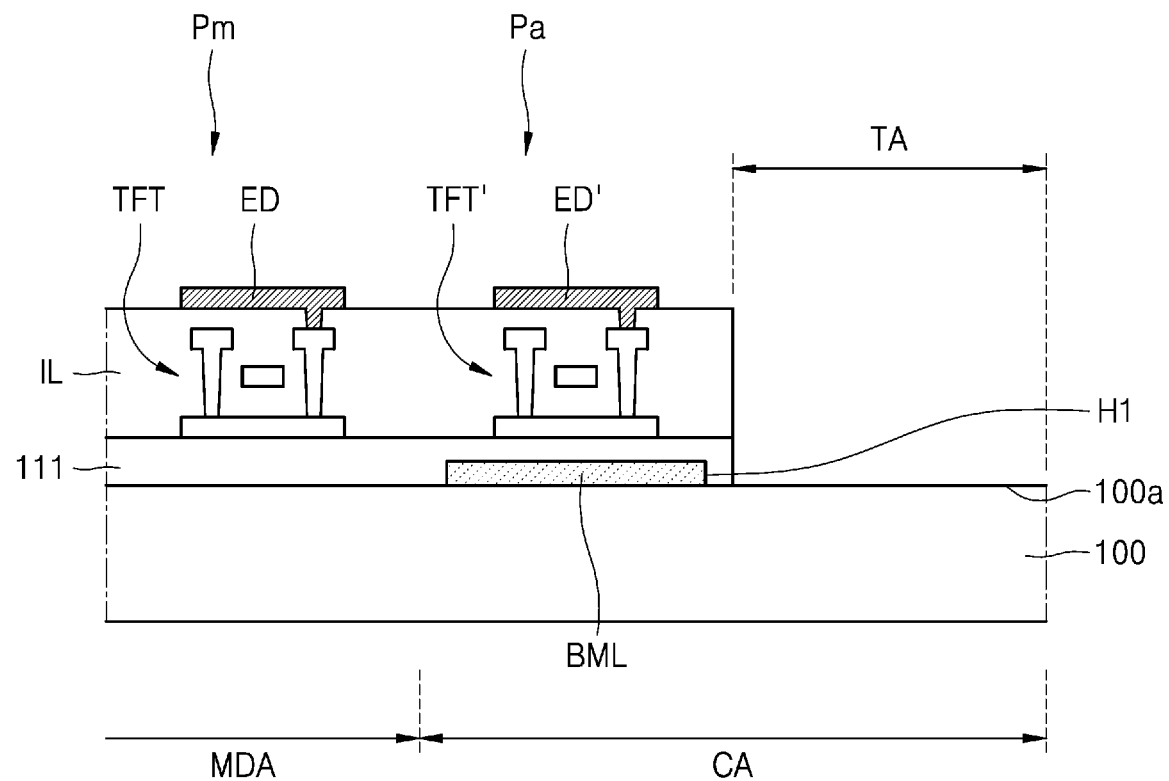

Referring to FIG. 8, an operation of forming the main thin film transistor TFT and the main display element may be performed after the forming of the bottom metal layer BML on the one surface 100a of the substrate 100 to correspond to the component area CA. In addition, forming the auxiliary thin film transistor TFT' and the auxiliary display element may be performed after the forming of the bottom metal layer BML on the one surface 100a of the substrate 100 to correspond to the component area CA.

A buffer layer 111 and an inorganic insulating layer IL may be arranged on the one surface 100a of the substrate 100 in the main display area MDA, and the main thin film transistor TFT including a semiconductor layer, a gate electrode, a source electrode, and a drain electrode may be provided in the inorganic insulating layer IL.

A buffer layer 111 and an inorganic insulating layer IL may be arranged on the bottom metal layer BML in the component area CA, and the auxiliary thin film transistor TFT' including a semiconductor layer, a gate electrode, a source electrode, and a drain electrode may be provided in the inorganic insulating layer IL.

A main light emitting element ED as the main display element may be formed on the main thin film transistor TFT, and an auxiliary light emitting element ED' as the auxiliary display element may be formed on the auxiliary thin film transistor TFT'.

The main light emitting element ED may be electrically connected to the main thin film transistor TFT, and the auxiliary light emitting element ED' may be electrically connected to the auxiliary thin film transistor TFT.

The main thin film transistor TFT and the main light emitting element ED connected thereto may be arranged in the main display area MDA to implement a main subpixel Pm, and the auxiliary thin film transistor TFT' and the auxiliary light emitting element ED' connected thereto may be arranged in the component area CA to implement an auxiliary subpixel Pa. An area of the component area CA in which the auxiliary subpixel Pa is arranged may be referred to as an auxiliary display area.

In addition, the transmission area TA in which no display element is arranged may be arranged in the component area CA. The transmission area TA may be an area through which the light/signal output from the component 40 (see FIG. 2) or the light/signal input to the component 40, which is arranged to correspond to the component area CA, is transmitted. The auxiliary display area and the transmission area TA may be alternately arranged in the component area CA.

Figure 9:
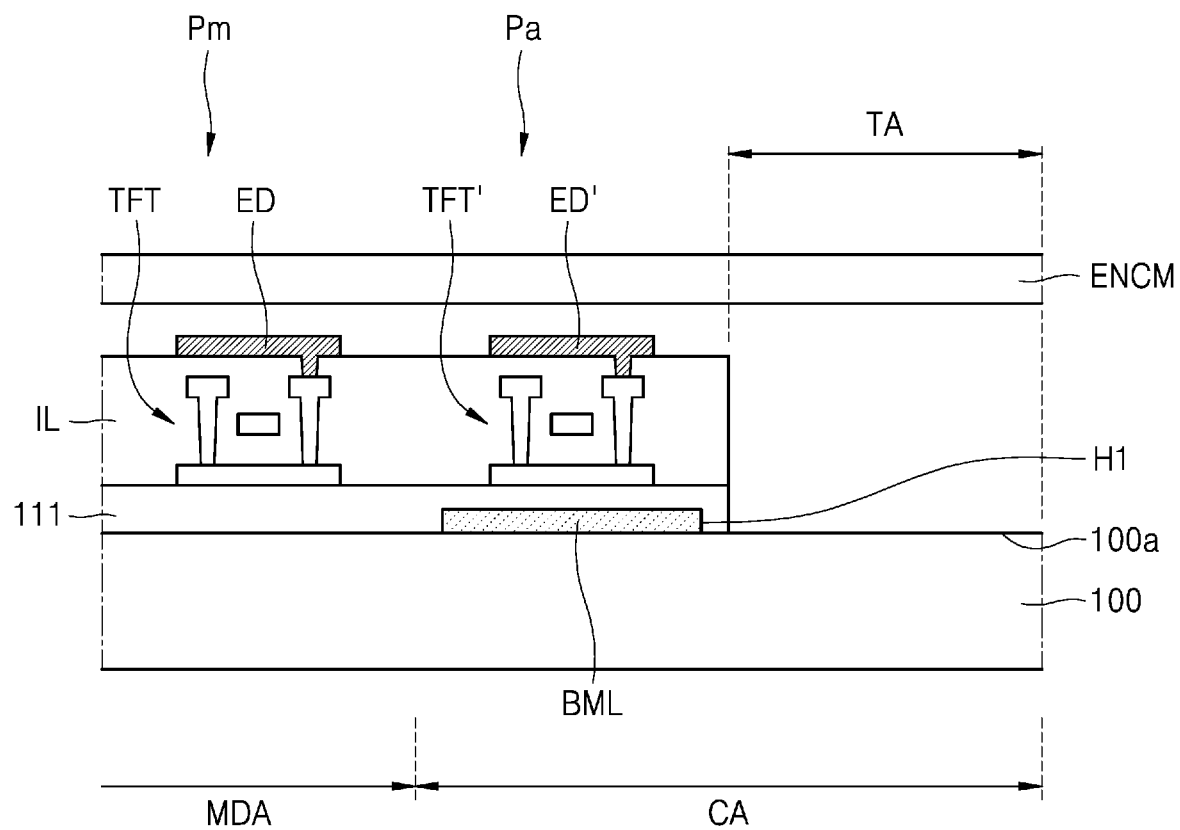

Referring to FIG. 9, an operation of forming the encapsulation substrate on the one surface 100a of the substrate 100 may be further performed after the operation of forming the main thin film transistor TFT and the main display element on the one surface 100a of the substrate 100. In addition, the operation of forming the encapsulation substrate on the one surface 100a may also be performed after the forming the auxiliary thin film transistor TFT' and the auxiliary display element on the bottom metal layer BML.

The main display element of the main display area MDA and the auxiliary display element of the component area CA may be covered with an encapsulation member ENCM. For example, the encapsulation member ENCM may include an encapsulation substrate. The encapsulation substrate may be arranged to face the substrate 100, and a gap may be between the encapsulation substrate and the display elements. The encapsulation substrate may include glass. A sealant including frit or the like may be arranged between the substrate 100 and the encapsulation substrate, and the sealant may be arranged in the peripheral area described above. The sealant arranged in the peripheral area may surround the display area DA to prevent moisture from penetrating through the side surface thereof.

Figure 10:
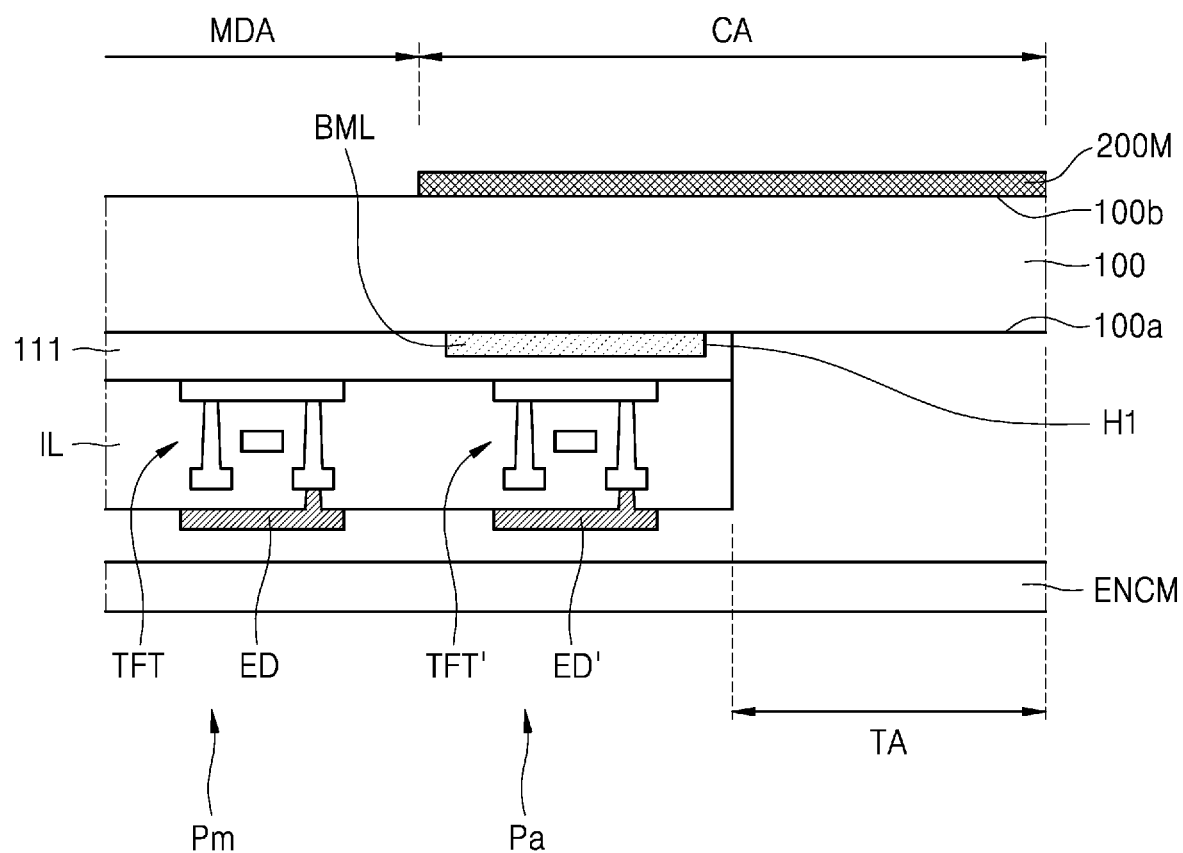

Referring to FIG. 10, an operation of forming the colored material layer 200M on the other surface 100b of the substrate 100 may be performed after the operation of forming the encapsulation substrate on the one surface 100a of the substrate 100. For example, the colored material layer 200M may be directly formed on the other surface 100b of the substrate 100.

The colored material layer 200M may include a colored pigment, for example, a pigment of a certain color such as white or black. In an exemplary embodiment of the present invention, the colored material layer 200M may have a black color. For example, the colored material layer 200M may include a polyimide (PI)-based binder and a pigment in which red, green, and blue colors are mixed. In addition, the colored material layer 200M may include a cardo-based binder resin and a mixture of lactam-based black pigment and blue pigment. In addition, the colored material layer 200M may include a carbon black or a light blocking material. The colored material layer 200M may include a positive photosensitive material.

Figure 11:
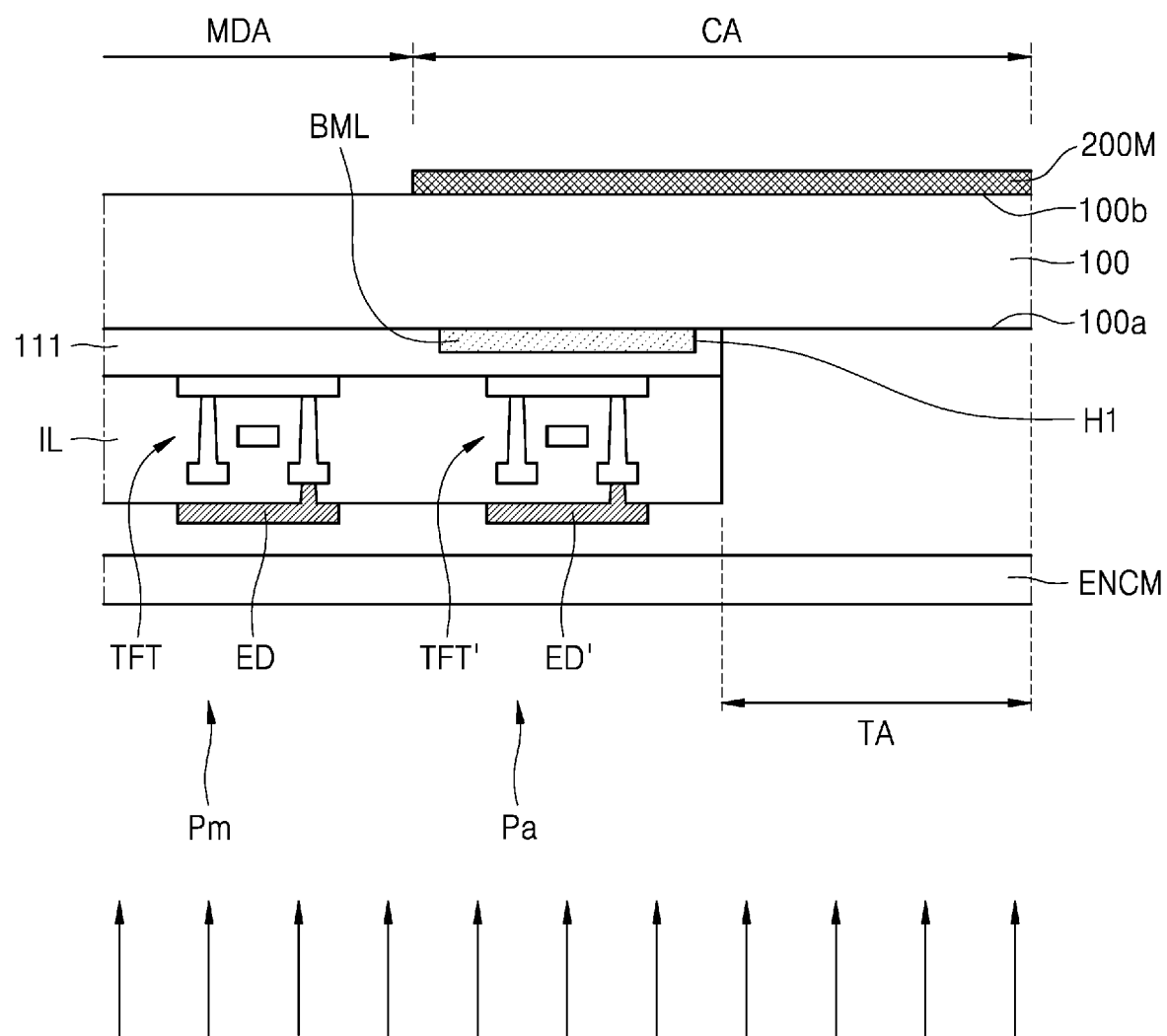

Referring to FIG. 11, an operation of exposing a portion of the colored material layer 200M by irradiating light onto the one surface 100a of the substrate 100 may be performed after the operation of forming the colored material layer 200M on the other surface 100b of the substrate 100.

In a structure in which the bottom metal layer BML is arranged in the component area CA, a flare causing image quality degradation may occur because the light emitted from the component may be reflected by the bottom metal layer BML.

According to an exemplary embodiment of the present invention, it may be possible to prevent a flare from occurring by forming the anti-reflection layer 200 on the other surface 100b opposite to the one surface 100a of the substrate 100 to overlap the bottom metal layer BML arranged on the one surface 100a of the substrate 100.

In this case, when forming the anti-reflection layer 200 to overlap the bottom metal layer BML, by patterning the colored material layer 200M by using the bottom metal layer BML arranged on the one surface 100a of the substrate 100 as a reflection layer (e.g., a mask), the anti-reflection layer 200 overlapping the bottom metal layer BML may be formed without using an additional mask.

In the operation of exposing a portion of the colored material layer 200M, light may be irradiated onto the one surface 100a of the substrate 100 on which the bottom metal layer BML is arranged. For example, light for exposing a portion of the colored material layer 200M may be irradiated on the one surface 100a of the substrate 100 where the bottom metal layer BML, the thin film transistors TFT and TFT', the display element, and the encapsulation member ENCM are formed.

In the operation of exposing a portion of the colored material layer 200M, a portion of the colored material layer 200M may be exposed by using the bottom metal layer BML arranged on the one surface 100a of the substrate 100 as a mask, instead of exposing a portion of the colored material layer 200M by adding a mask in the process of the related art. For example, the bottom metal layer BML arranged on the one surface 100a of the substrate 100 may function as a mask to expose a portion of the colored material layer 200M. In this case, because the colored material layer 200M may include a positive photosensitive material, a portion of the colored material layer 200M irradiated with light may be removed to form the anti-reflection layer 200 overlapping the bottom metal layer BML, in the operation of developing the exposed colored material layer 200M described below.

Figure 12:
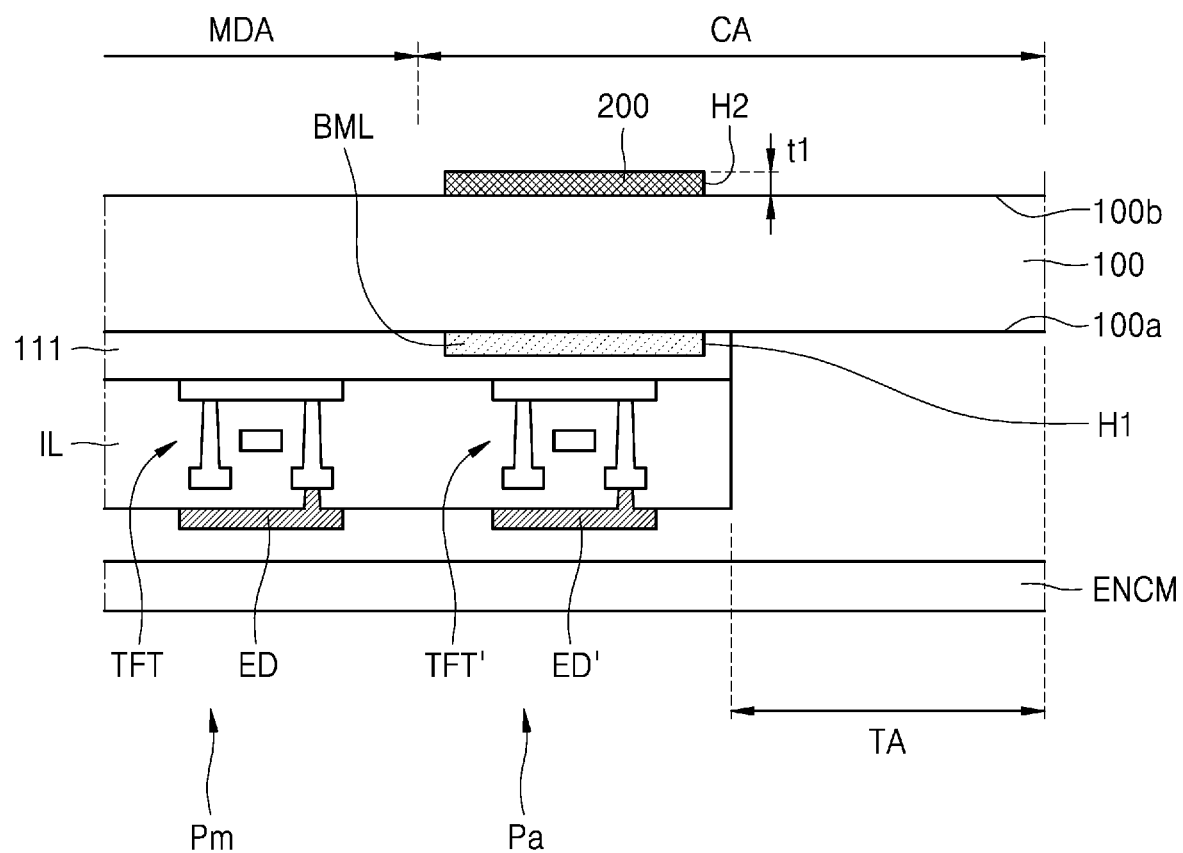

Referring to FIG. 12, an operation of forming the anti-reflection layer 200 by developing the exposed colored material layer 200M may be performed after the operation of exposing a portion of the colored material layer 200M by irradiating light onto the one surface 100a of the substrate 100 where the bottom metal layer BML is arranged.

For example, the colored material layer 200M may include a positive photosensitive material. Because the colored material layer 200M includes a positive photosensitive material, light may be irradiated onto the colored material layer 200M not overlapping the bottom metal layer BML in the operation of exposing the colored material layer 200M, and the colored material layer 200M irradiated with light may be removed to pattern the anti-reflection layer 200 in the operation of developing the exposed colored material layer 200M.

The anti-reflection layer 200 may overlap the bottom metal layer BML with the substrate 100 therebetween. In an exemplary embodiment of the present invention, the width of the bottom metal layer BML may be smaller than the width of the anti-reflection layer 200, and thus, the bottom metal layer BML may be entirely overlapped by the anti-reflection layer 200 in the direction perpendicular to the substrate 100.

The anti-reflection layer 200 may include a second hole H2 corresponding to the transmission area TA. The second hole H2 formed in the anti-reflection layer 200 may overlap the first hole H1 formed in the bottom metal layer BML. For example, the second hole H2 formed in the anti-reflection layer 200 and the first hole H1 formed in the bottom metal layer BML may overlap each other with the substrate 100 therebetween. In an exemplary embodiment of the present invention, the second hole H2 of the anti-reflection layer 200 may be equal to or narrower than the first hole H1 of the bottom metal layer BML.

Figure 13:
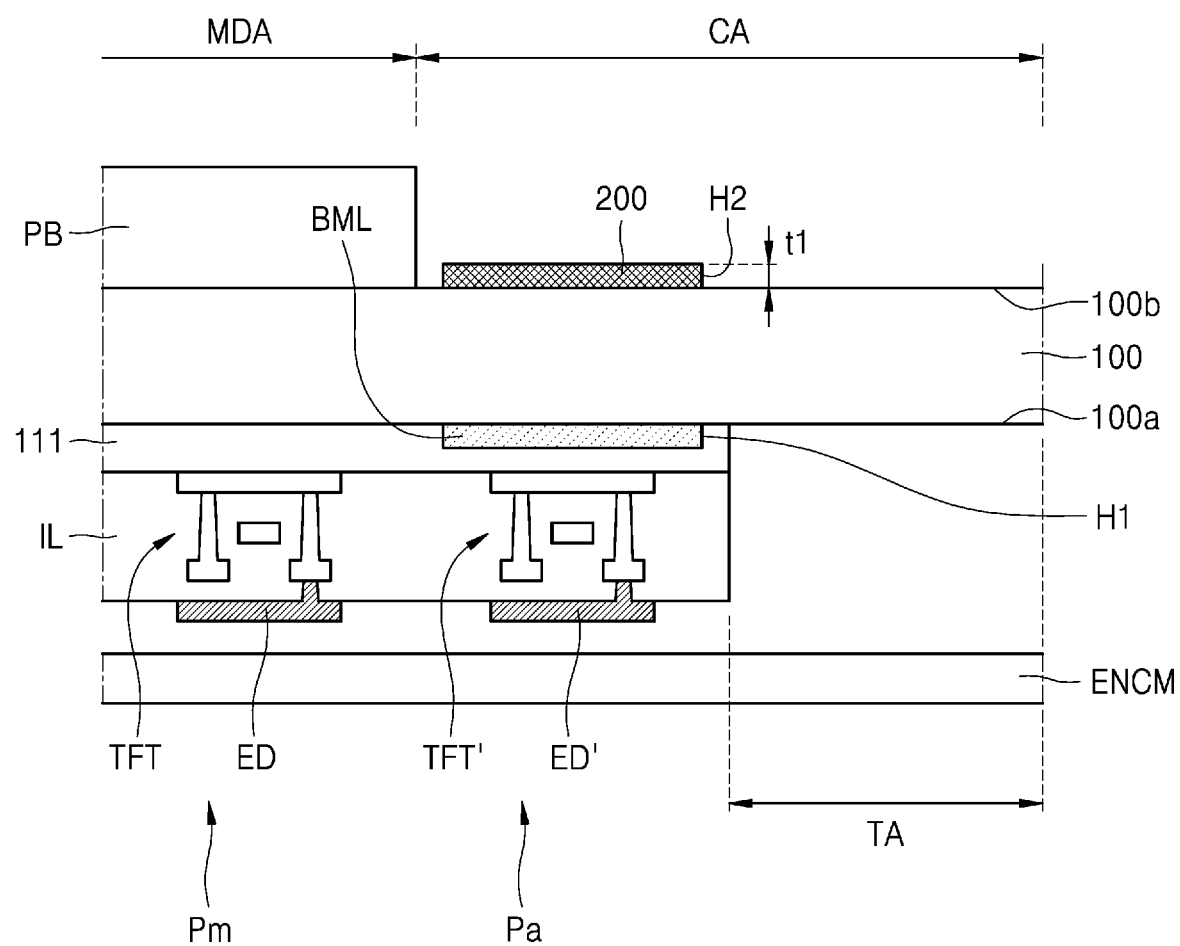

Referring to FIG. 13, an operation of forming the protection member PB on the other surface 100b of the substrate 100 to correspond to the main display area MDA may be performed after the operation of forming the anti-reflection layer 200 by developing the exposed colored material layer 200M.

The protection member PB may be attached to the other surface 100b of the substrate 100 to support and protect the substrate 100.

According to an exemplary embodiment of the present invention, to prevent a flare, which may cause image quality degradation, from occurring because of light reflected by a bottom metal layer provided on one surface of a substrate, an anti-reflection layer may be patterned on the other surface of the substrate to overlap the bottom metal layer. In this case, by patterning the anti-reflection layer by using the bottom metal layer arranged on one surface of the substrate as a reflection layer (e.g., a mask), the anti-reflection layer overlapping the bottom metal layer may be patterned without using an additional mask.

According to an exemplary embodiment of the present invention, it may be possible to prevent the occurrence of a flare by patterning an anti-reflection layer on the other surface, opposite to one surface, of a substrate without an additional mask by using a bottom metal layer, arranged on the one surface of the substrate, as a reflection layer. However, the scope of the present invention is not limited to these effects.

While the present invention has been described with reference to exemplary embodiments thereof, it will be understood by those of ordinary skill in the art that various changes in form and details may be made thereto without departing from the spirit and scope of the present invention.

What is claimed is:

1. A display apparatus comprising:
   a main display area;
   a component area including a transmission area;
   a peripheral area adjacent to the main display area; a substrate;
   main display elements arranged on a first surface of the substrate in the main display area, wherein main pixel circuits are respectively connected to the main display elements;
   auxiliary display elements arranged on the first surface of the substrate in the component area, wherein auxiliary pixel circuits are respectively connected to the auxiliary display elements;
   a bottom metal layer arranged between the substrate and the auxiliary pixel circuits in the component area; and
   an anti-reflection layer arranged on a second surface, opposite to the first surface, of the substrate, and overlapping the bottom metal layer in the component area,
   wherein the bottom metal layer includes a first hole corresponding to the transmission area,
   wherein the anti-reflection layer includes a second hole corresponding to the transmission area, and
   wherein the first hole and the second hole overlap each other.

2. The display apparatus of claim 1, wherein the anti-reflection layer is directly arranged on the second surface of the substrate.

3. The display apparatus of claim 2, wherein the anti-reflection layer has a first thickness of about 1 µm to about 3 µm.

4. The display apparatus of claim 2, wherein the anti-reflection layer includes a positive photosensitive material.

5. The display apparatus of claim 2, wherein the anti-reflection layer includes a light blocking material.

6. The display apparatus of claim 1, further comprising an encapsulation substrate arranged on the first surface of the substrate.

7. The display apparatus of claim 1, further comprising a component arranged on the second surface of the substrate in the component area,
   wherein the component includes an imaging device or a sensor.

8. The display apparatus of claim 1, further comprising a protection member arranged on the second surface of the substrate in the main display area.

* * * * *